United States Patent
Ogasawara

(10) Patent No.: US 8,248,580 B2
(45) Date of Patent: Aug. 21, 2012

(54) SCANNING EXPOSURE APPARATUS AND METHOD OF MANUFACTURING DEVICE

(75) Inventor: Makiko Ogasawara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 688 days.

(21) Appl. No.: 12/433,698

(22) Filed: Apr. 30, 2009

(65) Prior Publication Data

US 2009/0274983 A1    Nov. 5, 2009

(30) Foreign Application Priority Data

May 1, 2008    (JP) ................. 2008-119982

(51) Int. Cl.
G03B 27/52    (2006.01)
G03B 27/42    (2006.01)
G03B 27/32    (2006.01)

(52) U.S. Cl. ............... 355/55; 355/53; 355/77

(58) Field of Classification Search ...... 355/53, 355/55, 56, 61, 77; 356/124; 430/30
See application file for complete search history.

(56) References Cited

U.S. PATENT DOCUMENTS

| | | | |
|---|---|---|---|
| 6,674,511 B2 | 1/2004 | Nomura et al. | |
| 7,190,443 B2 | 3/2007 | Shiode | |
| 7,221,434 B2 | 5/2007 | Shiode et al. | |
| 7,495,742 B2 | 2/2009 | Shiode | |
| 2002/0041377 A1 | 4/2002 | Hagiwara et al. | |
| 2003/0133099 A1* | 7/2003 | Shiode | 356/124 |
| 2006/0268255 A1* | 11/2006 | Shiode et al. | 355/75 |

FOREIGN PATENT DOCUMENTS

| | | |
|---|---|---|
| JP | 2002-014005 A | 1/2002 |
| JP | 2002-055435 A | 2/2002 |
| JP | 2003-318090 A | 11/2003 |
| JP | 2005-175407 A | 6/2005 |
| JP | 2006-279029 A | 10/2006 |
| WO | 2003-021352 A | 3/2003 |

OTHER PUBLICATIONS

H. Nomura, "New phase shift gratings for measuring aberrations", SPIE, vol. 4346 (2001), pp. 25-35.

* cited by examiner

*Primary Examiner* — Hung Henry Nguyen
*Assistant Examiner* — Steven H Whitesell Gordon
(74) *Attorney, Agent, or Firm* — Canon U.S.A., Inc. IP Division

(57) ABSTRACT

A scanning exposure apparatus (300) includes a first stage (325), a second stage (345), a projection optical system (330), a first measurement unit (20) arranged on the second stage (345), and a controller (350). A measurement mask (10) is arranged on the first stage (325). The first measurement unit (20) includes a light-shielding member having an opening, and measures the intensity of light having passed through the opening in a light intensity distribution formed on the light-shielding member when at least one of the first stage (325) and the second stage (345) is scanned and a measurement pattern of the measurement mask (10) is obliquely illuminated. The controller (350) calculates the defocus amount, while at least one of the first stage (325) and the second stage (345) is scanned, based on a temporal change in the light intensity measured by the first measurement unit (20).

9 Claims, 19 Drawing Sheets

F I G. 13
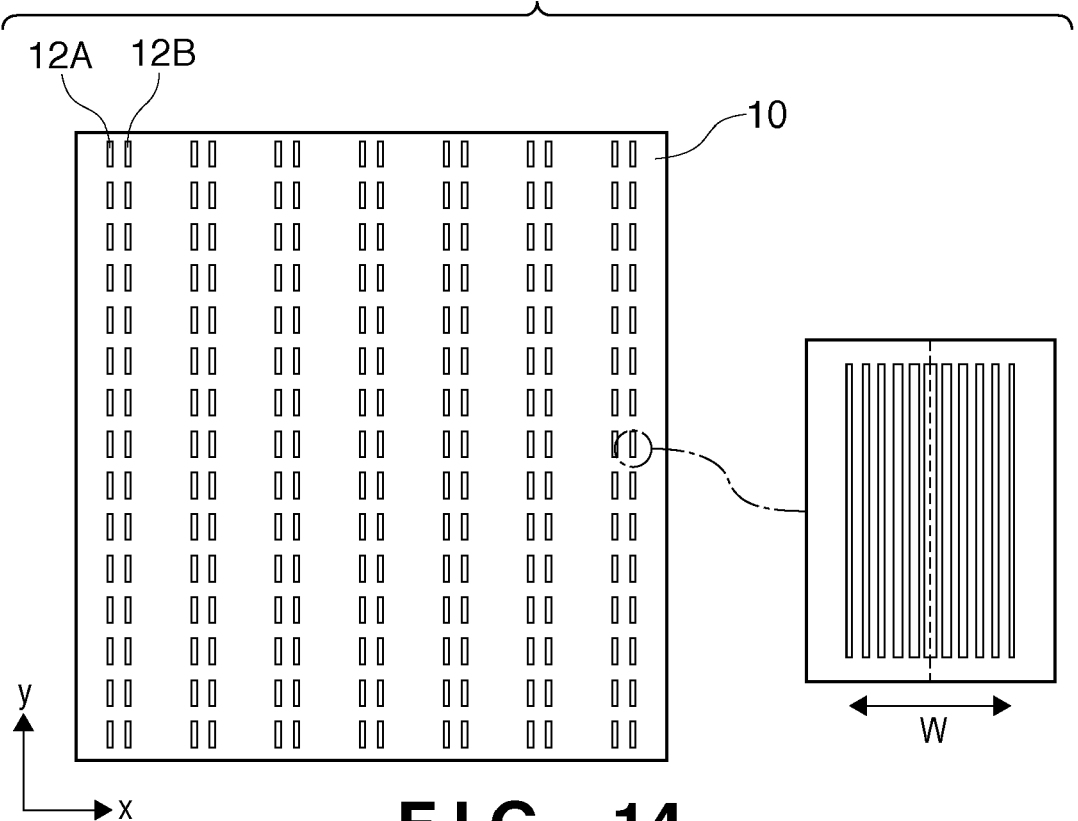
F I G. 14
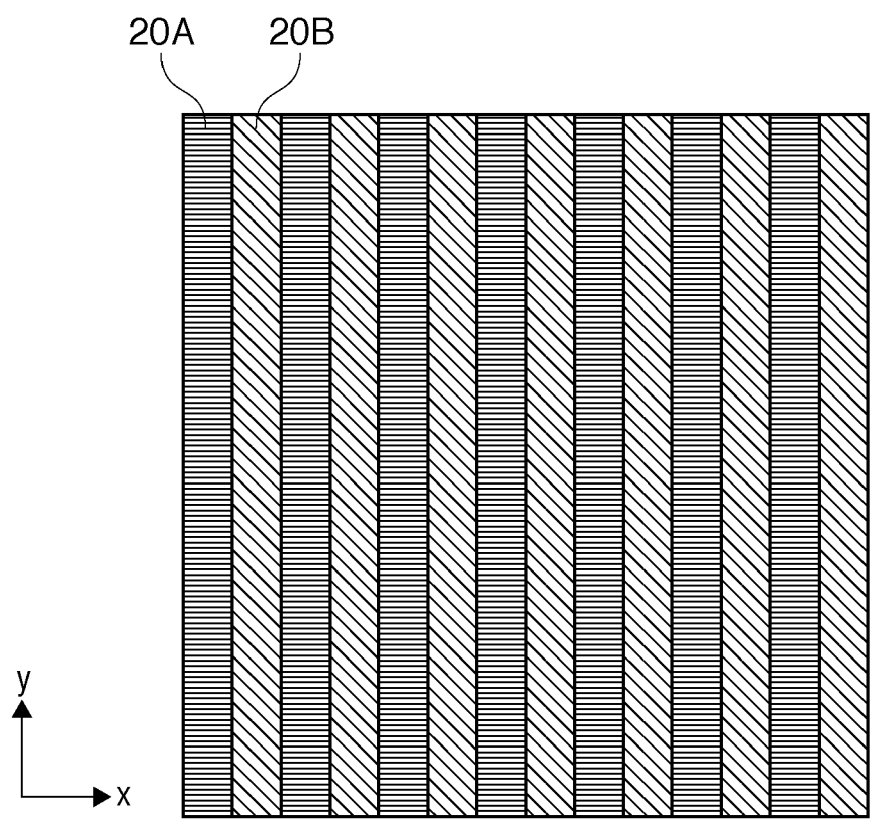

SCANNING EXPOSURE APPARATUS AND METHOD OF MANUFACTURING DEVICE

BACKGROUND OF THE INVENTION

1. Field of the Invention

The present invention relates to a scanning exposure apparatus and a method of manufacturing a device.

2. Description of the Related Art

A projection exposure apparatus has been conventionally employed in manufacturing micropatterned semiconductor devices such as a semiconductor memory and a logic circuit using photolithography. The projection exposure apparatus projects and transfers a circuit pattern drawn on a reticle (mask) onto a substrate such as a wafer by a projection optical system. These days, to keep up with the demands for advances in micropatterning of semiconductor devices, the projection exposure apparatus has achieved a high resolution to the degree that it forms by exposure a pattern with a feature size that is half the exposure wavelength or less, leading to ceaseless demands for further improvements, that is, increases in its resolution.

An increase in the resolution of the exposure apparatus is generally achieved by shortening the wavelength of the exposure light, and increasing the numerical aperture (NA) of the projection optical system. However, the shortening of the wavelength of the exposure light and the increase of the NA of the projection optical system are insufficient to achieve an increase in the resolution of the exposure apparatus, and the performance of the exposure apparatus itself must improve. For example, the recent projection optical system suffers much less aberration than ever. In addition, the conventional illumination optical system has been allowed to use non-polarized illumination alone, but the recent illumination optical system realizes polarized illumination. Herein, polarized illumination means an illumination scheme which controls the polarization state of the illumination light in accordance with the reticle pattern.

In order to continue to upgrade the exposure apparatus, it includes a measurement device which measures various types of optical characteristics, and a correction unit which corrects the optical characteristics based on the measurement results obtained by the measurement device. For example, an exposure apparatus which can measure and correct the aberration of a projection optical system as mounted in the exposure apparatus has been proposed. Examples of measurable optical characteristics other than the aberration of the projection optical system are the NA of the projection optical system, the polarization state of the illumination light, the curvature of field, the exposure amount, the uniformity of the exposure amount, the illumination light distribution, and the Jones matrix of the projection optical system.

Exposure apparatuses are roughly classified into an exposure apparatus of the step & repeat scheme (a stepper), and an exposure apparatus of the step & scan scheme (a scanner). A scanner is more suitable for coping with an increase in the NA than a stepper, and therefore is an exposure apparatus that sustains the recent increase in the resolution.

A scanner transfers the pattern of a reticle onto a wafer by scanning them. Unless the focus between the reticle surface and the wafer surface during scanning is adjusted precisely, the imaging position deviates from a best focus position, blurring and deteriorating the formed optical image. That is, defocus occurs on the scanning image plane during scanning. Along with the recent increase in the NA of the exposure apparatus, the depth of focus (DOF) is decreasing. It is therefore becoming increasingly important to control the focus.

To determine a best focus position of the projection optical system, it is a common practice to print a certain pattern on a wafer or analyze an aerial image. Japanese Patent Laid-Open Nos. 2003-318090 and 2002-14005 respectively introduce these prior arts. In the former method, a test pattern is formed by exposure on a wafer coated with a resist, and the developed resist pattern is observed. In the latter method, an aerial image of a test pattern is formed near the object plane of the projection optical system, a change in the intensity of the aerial image is photo-electrically converted by scanning the aerial image by a knife edge or a slit opening, and the obtained signal is analyzed.

Unfortunately, it has been difficult for the prior arts to measure a deviation of the focus position during scanning in real time. The focus position measured by the method of printing a certain pattern on a wafer is the integrated value of deviations of the focus position which have occurred during scanning, and therefore is not a real-time focus position. Also, the optical image measured in the method of analyzing an aerial image is thought to be the one obtained by integrating deviations of the focus position because this method requires scanning to obtain optical image data, and therefore the measured focus position is not a real-time focus position, either. Both Japanese Patent Laid-Open Nos. 2003-318090 and 2002-14005 disclose no method of measuring a deviation of the imaging position during scanning. In other words, Japanese Patent Laid-Open Nos. 2003-318090 and 2002-14005 measure the light intensity distribution integrated after scanning exposure or that formed by exposure in a stationary state.

SUMMARY OF THE INVENTION

The present invention provides a scanning exposure apparatus which accurately measures the defocus amount while at least one of a stage which holds a reticle and a stage which holds a substrate is scanned.

According to the present invention, there is provided a scanning exposure apparatus comprising a first stage which holds a reticle, a second stage which holds a substrate, a projection optical system which projects a pattern of the reticle onto the substrate, a first measurement unit arranged on the second stage, and a controller, wherein a measurement mask is arranged on the first stage the first measurement unit includes a light-shielding member having an opening, and a photoelectric conversion element which receives light having passed through the opening, and measures, by the photoelectric conversion element, an intensity of light having passed through the opening in a light intensity distribution formed on the light-shielding member when at least one of the first stage and the second stage is scanned and a measurement pattern of the measurement mask is obliquely illuminated, and the controller calculates a defocus amount, while at least one of the first stage and the second stage is scanned, based on a temporal change in the light intensity measured by the first measurement unit.

According to the present invention, it is possible to provide a scanning exposure apparatus which accurately measures the defocus amount while at least one of a stage which holds a reticle and a stage which holds a substrate is scanned.

Further features of the present invention will become apparent from the following description of exemplary embodiments with reference to the attached drawings.

BRIEF DESCRIPTION OF THE DRAWINGS

FIG. 13 is a view illustrating an example of a state in which sets of measurement masks are arranged in correspondence with respective angles of view in the exposure region;

FIG. 14 is a view illustrating an example of a state in which sets of first measurement units are arranged in correspondence with respective angles of view in the exposure region;

DESCRIPTION OF THE EMBODIMENTS

Figure 1:
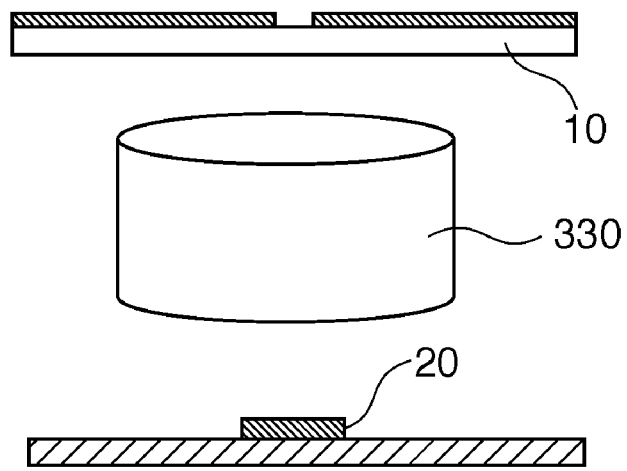
FIG. 1 is a schematic view showing the configuration of a measurement apparatus which measures the defocus amount.

Preferred embodiments of the present invention will be described below with reference to the accompanying drawings. Note that the same reference numerals denote the same members throughout the drawings, and a repetitive description thereof will not be given.

A defocus amount measurement principle according to the present invention will be explained first. By a measurement method according to that principle, a scanning exposure apparatus (scanner) measures the defocus amount (scan defocus amount) of the image plane while scanning at least one of a reticle stage and a substrate stage. In other words, a scanning exposure apparatus measures the image plane while scanning a reticle held by a reticle stage and a substrate held by a substrate stage. The reticle stage constitutes a first stage which holds a reticle, and the substrate stage constitutes a second stage which holds a substrate. The scanning exposure apparatus projects and transfers the reticle pattern onto the substrate via a projection optical system while scanning these two stages in synchronism with each other.

FIG. 1 is a schematic view for explaining a measurement method for a scanning exposure apparatus according to the present invention. A measurement apparatus 1 for measuring the defocus amount includes a measurement mask 10 and first measurement unit 20, as shown in FIG. 1. Let λ be the wavelength of exposure light of a scanning exposure apparatus, NA be the image-side numerical aperture of a projection optical system, and σ be the ratio between the numerical aperture formed by a light beam guided from an illumination optical system to a reticle, and the object-side numerical aperture of the projection optical system. The σ value can be changed by various types of members which constitute the illumination optical system. A general exposure apparatus has a maximum σ value smaller than 1. In the exposure apparatus, the image-side numerical aperture NA of the projection optical system and the wavelength λ of the exposure light take various values, so the pattern sizes (e.g., the pattern periods) of the measurement mask 10 and first measurement unit 20 can be normalized by (λ/NA).

The measurement mask 10 serves to measure a deviation of the focus position, and is arranged on a reticle stage serving as the first stage of the scanning exposure apparatus. The measurement mask 10 has a measurement pattern 12 on the side of a projection optical system 330. The measurement pattern 12

(to be described later) is a special pattern for measuring a deviation of the focus position.

The first measurement unit 20 is arranged on a substrate stage serving as the second stage. When at least one of the reticle stage and the substrate stage is scanned, the first measurement unit 20 measures a light beam which is diffracted by the measurement pattern 12 and is converged (forms an image) on the image plane (substrate surface) via the projection optical system 330. More specifically, the first measurement unit 20 measures the light intensity of a light intensity distribution formed by the measurement pattern 12 of the measurement mask 10. The configuration of the first measurement unit 20 will be described in detail later.

In this embodiment, the first measurement unit 20 measures the intensity of a light intensity distribution formed by the measurement pattern 12, while the measurement mask 10 which is arranged on the reticle stage and has the measurement pattern 12, and the first measurement unit 20 arranged on the substrate stage are scanned in synchronism with each other. Then, a controller can calculate a deviation of the focus position by analyzing the light intensity of the light intensity distribution measured by the first measurement unit 20. More specifically, the controller calculates the defocus amount during scanning based on a temporal change in the light intensity, or calculates the displacement amount of the light intensity distribution based on a temporal change in the light intensity, thereby calculating the defocus amount from a correlation between the displacement amount of the light intensity distribution and the focus position.

Figure 2:
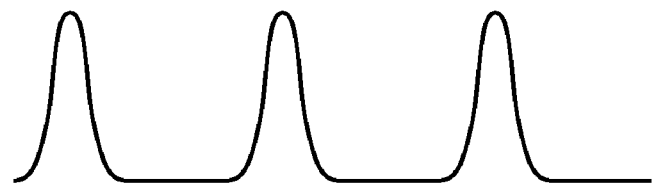
FIG. 2 is a view illustrating an example of a light intensity distribution formed by a measurement pattern.
Figure 4:
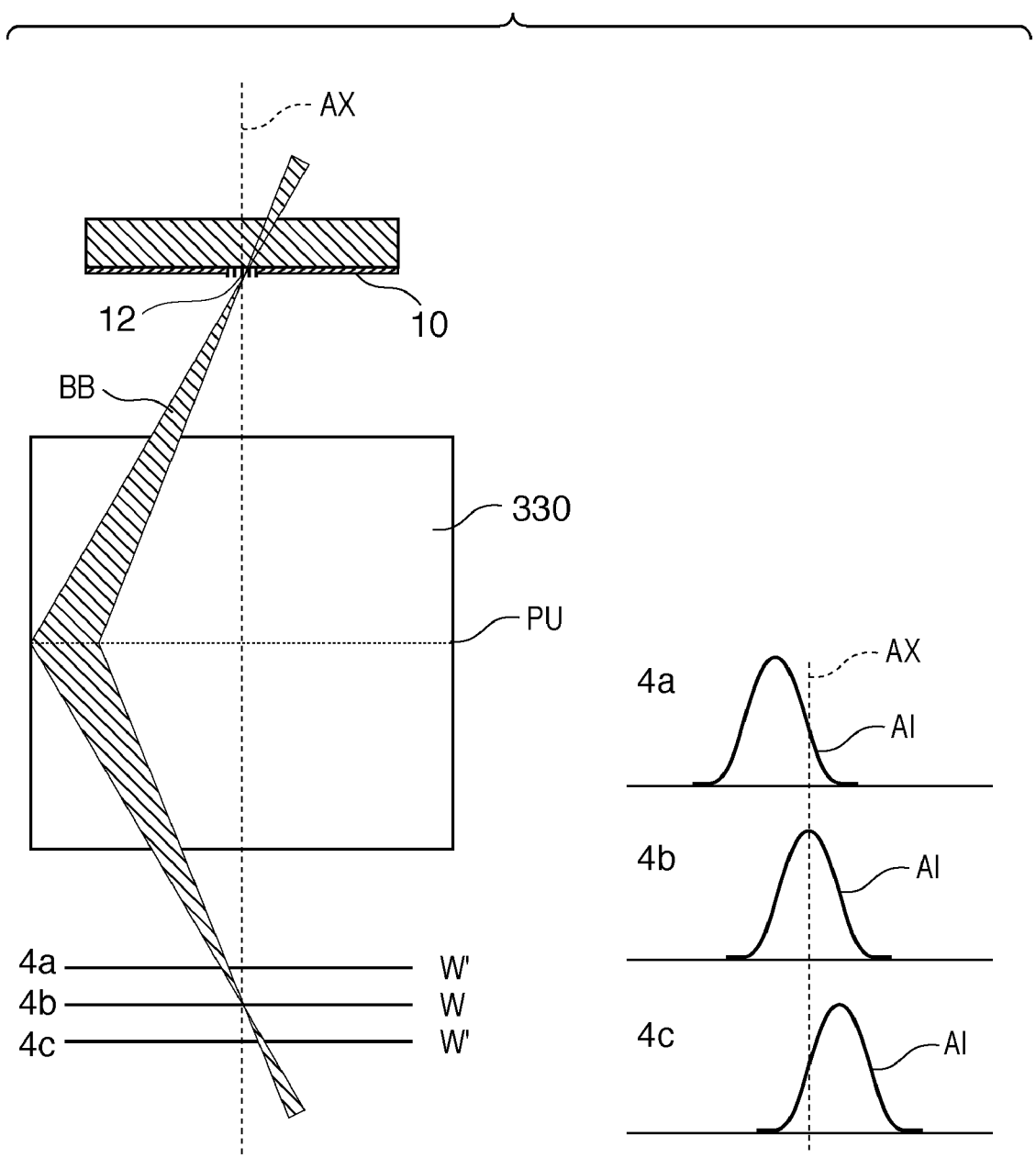
FIG. 4 is a view illustrating an example of the illumination state in which the measurement pattern is irradiated, and the light intensity distributions in this state.

The measurement mask 10 and the first measurement unit 20 will be explained in detail. The measurement pattern 12 of the measurement mask 10 is, for example, a special diffraction mark (to be referred to as a YAMATO mark hereinafter) or a line-and-space (L&S) pattern, as described in PCT(WO) 03/021352 or Japanese Patent Laid-Open No. 2003-318090, and forms a light intensity distribution as shown in FIG. 2. However, the measurement pattern 12 is not limited to an L&S pattern, and patterns with various shapes such as an ISO pattern and a contact hole pattern can be adopted. The direction in which measurement patterns 12 align themselves can be various directions such as a direction (V) parallel to the scanning direction in which the reticle stage and the substrate stage are scanned in synchronism with each other, a direction (H) perpendicular to the scanning direction, and directions inclined with respect to the scanning direction by $(1/4)\pi$, $(3/4)\pi$, $(5/4)\pi$, and $(7/4)\pi$. Likewise, the direction in which first measurement units 20 align themselves can be various directions such as a direction (V) parallel to the scanning direction in which the reticle stage and the substrate stage are scanned in synchronism with each other, a direction (H) perpendicular to the scanning direction, and directions inclined with respect to the scanning direction by $(1/4)\pi$, $(3/4)\pi$, $(5/4)\pi$, and $(7/4)\pi$. Note that FIG. 2 is a view illustrating an example of a light intensity distribution formed by the measurement pattern 12 of the measurement mask 10. Upon obliquely illuminating these measurement patterns 12, a displacement of the light intensity distribution occurs depending on the defocus amount. No displacement of the light intensity distribution occurs at a best focus position, as indicated by reference symbol 4b. In contrast, if a defocus is present, as indicated by reference symbol 4a or 4c, a displacement of the light intensity distribution occurs in the direction of defocus by the defocus amount. FIG. 4 illustrates an example of the relationship between a displacement of the optical image distribution when a YAMATO mark is used as the measurement pattern 12 of the measurement mask 10 and is imaged using oblique illumination by an illumination system, and the defocus amount under this condition.

Figure 3:
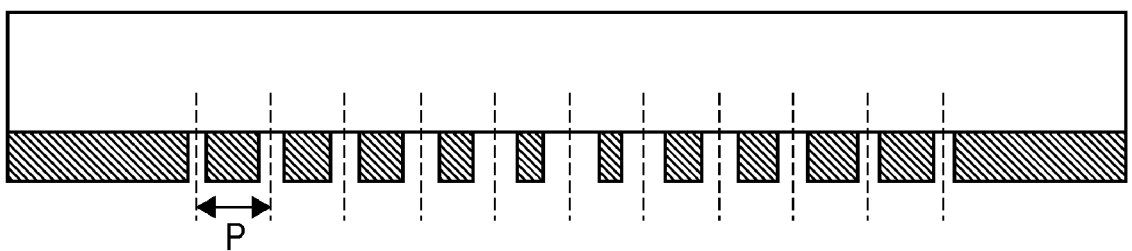
FIG. 3 is a view illustrating an example of the measurement pattern.
Figure 5:
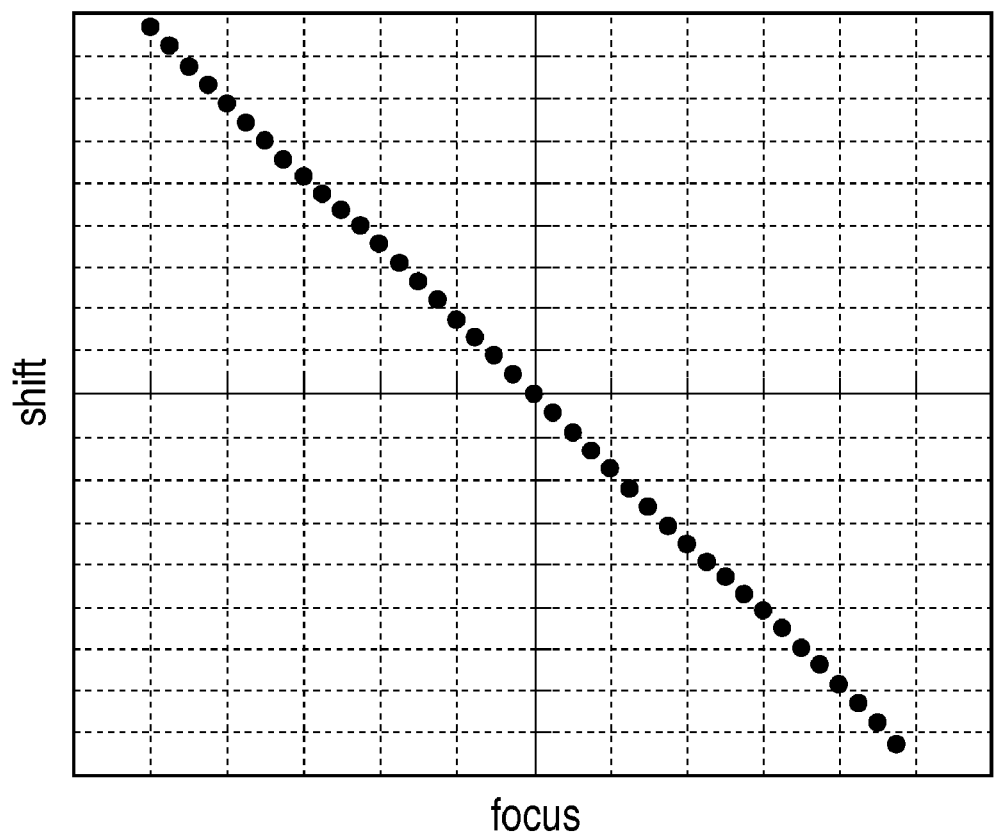
FIG. 5 is a graph schematically showing a correlation between a displacement of the light intensity distribution shown in FIG. 4, and the defocus amount.
Figure 6A:
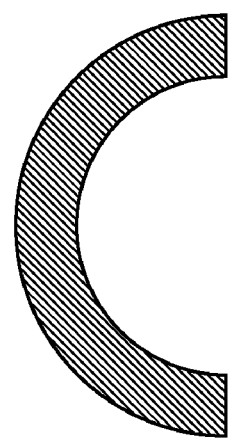
FIG. 6A is a view illustrating an example of the illumination state shown in FIG. 4.
Figure 6B:
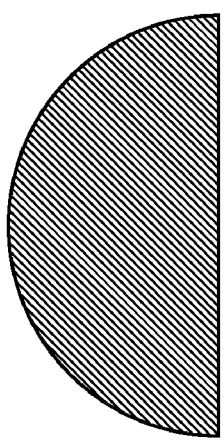
FIG. 6B is a view showing another example of the illumination state shown in FIG. 4.

The YAMATO mark is a line-and-space pattern as shown in FIG. 3. The YAMATO mark is a periodic pattern with lines which have a constant pitch and spaces which transmit light and have widths narrower in the direction from the central line or the central space to the outside. The light intensity distribution of a pattern image of the YAMATO mark, which is formed via the projection optical system 330, can be said to be one large pattern in which the spaces between lines are not resolved and which therefore suffers little distortion. If a period P normalized by ($\lambda$/NA) is set smaller than 1, ±1st-order light beams do not contribute to resolution depending on the incident angle of illumination light which irradiates the pattern. If the period P is set equal to or smaller than 0.5, ±1st-order light beams do not contribute to resolution independently of the incident angle of illumination light which irradiates the pattern, and almost only a 0th-order light beam contributes to form the light intensity distribution of the YAMATO mark. When, for example, the exposure wavelength $\lambda$ is 193 nm, the image-side numerical aperture NA of the projection optical system is 0.93, P≦103.8 nm for a period P of 0.5($\lambda$/0.93) or less. It is difficult to measure the displacement amount of the optical image distribution of a certain pattern imaged by first-order diffracted light beams, not only because it occurs due to defocus but also because the optical image itself blurs. However, it is possible to measure the displacement amount of the optical image distribution of the YAMATO mark because it is imaged only by a 0th-order light beam and therefore suffers less blur. When the YAMATO mark is imaged by obliquely incident light as shown in FIG. 4, a shift of the optical image corresponding to the defocus amount occurs, as shown in FIG. 4. FIG. 5 schematically shows a correlation between the defocus amount and the displacement amount (the shift amount) of the light intensity distribution under this condition. Examples of an illumination condition which implements this relationship are effective light source shapes as shown in FIGS. 6A and 6B, but the illumination condition is not limited to these examples.

Figure 7:
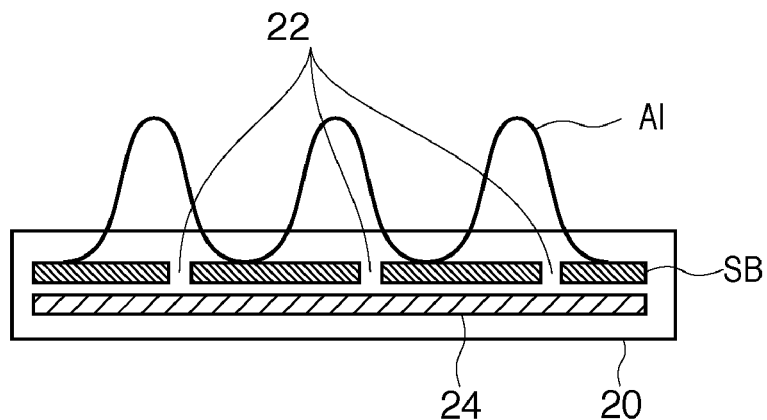
FIG. 7 is a schematic sectional view showing the configuration of a first measurement unit.

FIG. 7 is a schematic sectional view showing the first measurement unit 20. The first measurement unit 20 includes a light-shielding plate SB which has openings 22 and serves as a light-shielding member, and a light intensity sensor 24 which receives light having passed through the openings 22, as shown in FIG. 7. The light intensity sensor 24 measures the intensity of light having passed through the openings 22 in the light intensity distribution formed on the light-shielding member by the measurement pattern 12. The openings 22 are formed as, for example, small slits or pinholes in correspondence with the shape of the measurement pattern 12 of the measurement mask 10. The first measurement unit 20 is arranged such that the openings 22 each are positioned near a position at which the light intensity of a light intensity distribution AI formed by the measurement pattern 12 while the measurement mask 10 stands still is half its maximum value. The light intensity sensor 24 includes, for example, a photoelectric conversion element such as a CCD or a photodetector. The photodetector means herein an element which detects light energy by exploiting a photoelectric effect (e.g., the photovoltaic effect, the photoconductivity effect, or the photo-emissive effect) that converts photons into electrons. The photodetector responds to light incidence at a higher speed than a CCD. The photodetector can have a high response speed and a rise time of 0.1 µs or less.

Let I be the light intensity measured by the first measurement unit 20 when a light intensity distribution formed by the measurement pattern 12 while the measurement mask 10 and the first measurement unit 20 are scanned is not displaced. The light intensity measured by the first measurement unit 20 changes to I−α when the overall light intensity distribution is displaced to the left. As long as the shape of a light intensity distribution formed by the measurement pattern 12 is known in advance, the displacement amount of the light intensity distribution can be associated with the light intensity measured by the first measurement unit 20. As long as the defocus amount and the displacement amount of the light intensity distribution are known in advance, or a correlation between the defocus amount and the light intensity is known in advance, the defocus amount can be measured by measuring the light intensity, as shown in FIG. 4. The light intensity measured by the first measurement unit 20 changes to I+α when the overall light intensity distribution is displaced to the right, and the defocus amount in this case can be measured as in a displacement of the distribution to the left.

The output from the first measurement unit 20 can be represented as a function of a time t elapsed from when the measurement mask 10 and the first measurement unit 20 start to be scanned in synchronism with each other. Let I(t) be the output from the first measurement unit 20 herein. Analyzing the output I(t) from the first measurement unit 20 makes it possible to measure the displacement amount of the light intensity distribution at a certain time during scanning.

In this manner, the measurement apparatus 1 and measurement method according to this embodiment can represent the light intensity distribution at a certain position on the measurement mask 10 (the measurement pattern 12) as a function I(t) of time. That is, the light intensity distribution measured in the prior arts is the light intensity distribution for each position, whereas that measured in this embodiment is a temporal change in the light intensity distribution at a certain position. In other words, the difference between the prior arts and the present invention lies in whether the position of the first measurement unit 20 relative to the measurement mask 10 moves or does not move.

The first to fourth embodiments of the measurement apparatus 1 and measurement method according to the present invention will be described below.

First Embodiment

Figure 8A:
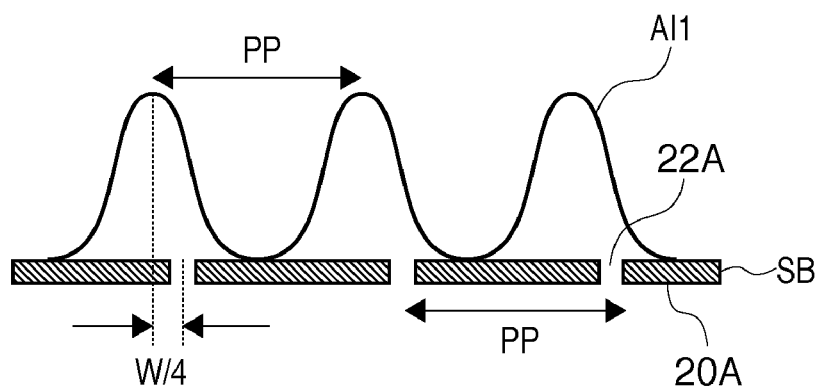
FIG. 8A is a view showing the positional relationship between a light intensity distribution formed by a measurement pattern, and openings of a first measurement unit.
Figure 8B:
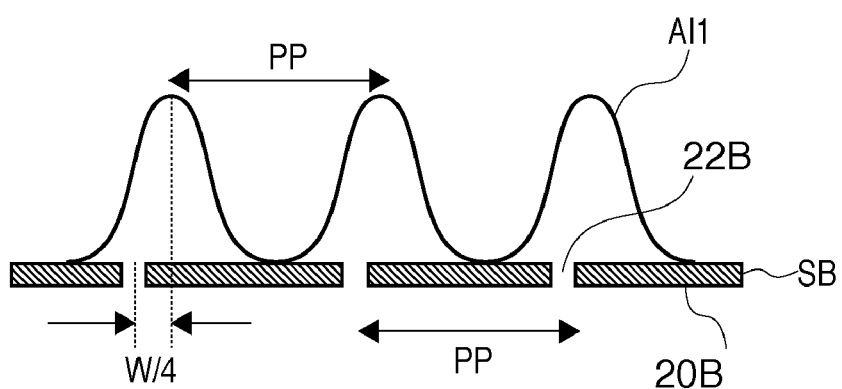
FIG. 8B is a view showing the positional relationship between a light intensity distribution formed by the measurement pattern, and openings of a first measurement unit.

In the first embodiment, the oblique illumination method is used, and a YAMATO mark is used as a measurement pattern 12 of a measurement mask 10. The measurement pattern 12 of the measurement mask 10 is a repetitive pattern which has a period PP and is formed by a YAMATO mark with a width W, and forms a light intensity distribution AI1 with the period PP, as shown in FIGS. 8A and 8B. Also, a plurality of measurement units 20 each including a light-shielding plate SB and light intensity sensor 24 are provided for a light intensity distribution AI1 formed by the measurement pattern 12. The light-shielding plate SB has openings 22 which are formed by small slits and have the period PP. The light intensity sensor 24 includes a photodetector and is arranged under the openings 22. Two of these first measurement units 20 will be referred to as measurement units 20A and 20B hereinafter. FIG. 8A is a view showing the positional relationship between a light intensity distribution formed by the measurement pattern 12 of the measurement mask 10, and openings 22A of the measurement unit 20A. FIG. 8B is a view showing the positional relationship between a light intensity distribution formed by the measurement pattern 12 of the measurement mask 10, and openings 22B of the measurement unit 20B.

The measurement unit 20A is arranged such that the openings 22A each are positioned at a position shifted by W/4 to the right from a position at which the light intensity is maximum in a light intensity distribution AI1 formed by the measurement pattern 12 while two stages are scanned in synchronism with each other, as shown in FIG. 8A. The measurement unit 20B is arranged such that the openings 22B each are positioned at a position shifted by W/4 to the left from a position at which the light intensity is maximum in a light intensity distribution AI1 formed by the measurement pattern 12 while the two stages are scanned in synchronism with each other, as shown in FIG. 8B. In the measurement units 20A and 20B, the openings 22A and 22B are parallel to the measurement pattern 12 of the measurement mask 10, and the directions in which the openings 22A and 22B are repeated are the same as that in which the lines and spaces of the measurement pattern 12 are repeated.

In the first embodiment, a YAMATO mark is used as the measurement pattern 12, and a light intensity distribution formed by it has a maximum gradient at a position shifted by W/4 from a position at which the light intensity is maximum. Hence, the measurement units 20A and 20B are sensitive to a change in the light intensity attributed to a displacement.

A case in which the absolute value of the displacement amount of the light intensity distribution AI1 is equal to or smaller than W/2 will be considered. As the light intensity distribution AI1 is displaced to the right, the light intensity measured by the measurement unit 20A increases, whereas that measured by the measurement unit 20B decreases. Also, as the light intensity distribution AI1 is displaced to the left, the light intensity measured by the measurement unit 20A decreases, whereas that measured by the measurement unit 20B increases. Analyzing such characteristics makes it possible to measure the displacement amount of the optical image of the YAMATO mark. The YAMATO mark causes a shift (a displacement of the optical image) in an amount having a nearly linear characteristic with respect to the defocus amount. Hence, as long as a correlation between the light intensity and a displacement of the light intensity distribution, and that between a displacement of the light intensity distribution and the defocus amount are detected in advance, the defocus amount can be measured by analyzing the light intensity.

A displacement amount S of the optical image of the YAMATO mark will be described in detail below. The YAMATO mark is imaged only by a 0th-order light beam, which propagates through it in the direction of a normal to the wavefront. Accordingly, the displacement amount S of the optical image of the YAMATO mark depends on the aberration amount of the projection optical system, and, using Zernike terms, is given by:

$$S_j = (Zer_{4j} \ \ldots \ Zer_{36j}) \begin{pmatrix} c4 \\ \vdots \\ c36 \end{pmatrix} \quad (1)$$

where $S_j$ is the displacement amount of the optical image [nm], $Zer_{ij}$ is the sensitivity of the YAMATO mark to the Zernike term [nm/mλ], Ci is the aberration amount of the projection optical system, i is the order of the Zernike term, and j is the mode of imaging by obliquely incident light.

The defocus amount can be rewritten as Zernike terms:

$$\begin{pmatrix} dZer_4 \\ \vdots \\ dZer_{36} \end{pmatrix} = \begin{pmatrix} dR_4 & dW_4 \\ \vdots & \vdots \\ dR_{36} & dW_{36} \end{pmatrix} \begin{pmatrix} def_R \\ def_W \end{pmatrix} \quad (2)$$

where dZer is the defocus amount of the reticle (wafer) upon being converted into a Zernike term [m$\lambda$], $def_{R(W)}$ is the defocus amount of the reticle (wafer) [nm], and dR(W) is the sensitivity of the YAMATO mark to defocus on the reticle (wafer) side [nm/m$\lambda$].

Then, the displacement amount S of the optical image of the YAMATO mark is given by:

$$S_j = (Zer_{4j} \ldots Zer_{36j})\left(\begin{pmatrix} c4 \\ \vdots \\ c36 \end{pmatrix} + \begin{pmatrix} dZer_4 \\ \vdots \\ dZer_{36} \end{pmatrix}\right) \quad (3)$$

Because the aberration of the projection optical system stays constant during scanning, a displacement of the optical image or a change in the intensity of the optical image attributed to the influence of the displacement are accounted for by a change in the defocus amount during scanning.

To accurately measure a change in the light intensity attributed to scan defocus, it is necessary to calibrate the positions of the measurement units 20A and 20B and the difference, between the light amounts measured by the measurement units 20A and 20B, which is attributed to manufacturing errors. The calibration of the light amounts measured by the measurement units 20A and 20B will be explained first. The measurement mask 10 and the openings 22 of the first measurement unit 20 must be manufactured to have the same size in principle, but certain amounts of errors are likely to occur in practice. When this occurs, the measurement units 20A and 20B measure different light intensities even if they are in a positional relationship that allows them to measure the same light intensity in principle, resulting in light intensity analysis errors. To calibrate the difference between the light amounts measured by the measurement units 20A and 20B so as to avoid such a situation, it is only necessary to acquire the relationship between the position and the light intensity by moving the measurement units 20A and 20B within the range of at least from −PP/2 to PP/2 during exposure in a stationary state. If the measurement mask 10 and the first measurement unit 20 are free from any manufacturing errors, they are supposed to measure the same total light amount of a light intensity distribution AI. If the measurement mask 10 and the first measurement unit 20 suffer manufacturing errors, they are supposed to measure different total light amounts of a light intensity distribution AI. The ratio between these total light amounts is thought to be that between the light amounts measured by the measurement units 20A and 20B, so the measured light intensities can be corrected by multiplying it by the light amount ratio. Alignment calibration need only be performed such that the values obtained by correcting the light intensities measured by the measurement units 20A and 20B using the above-mentioned light amount ratio are equal to each other.

Measurement of the defocus amount using one measurement mask 10 and two first measurement units 20 as mentioned above when the reticle stage is scanned and the substrate stage is fixed in position will be explained below. Note that the defocus amount is measured with reference to the substrate stage.

Measurement units 20A and 20B each include a light-shielding plate SB and light intensity sensor 24. The light-shielding plates SB have openings 22A and 22B which are formed by small slits and have a period PP. The light intensity sensors 24 include photodetectors and are arranged under the openings 22A and 22B. The widths of the openings 22A and 22B can be equal to or narrower than W/4. In the measurement units 20A and 20B, the openings 22A and 22B are parallel to a measurement pattern 12A of a measurement mask 10A, and the directions in which the openings 22A and 22B are repeated are the same as that in which the lines and spaces of the measurement pattern 12A are repeated.

The measurement unit 20A is arranged such that the openings 22A each are positioned at a position W/4 at which the light intensity is half its maximum value and which lies on the right side with respect to a position at which the light intensity is maximum in a light intensity distribution AI1 formed by the measurement pattern 12 during exposure in a stationary state, as shown in FIG. 8A. The measurement unit 20B is arranged such that the openings 22B each are positioned at a position −W/4 at which the light intensity is half its maximum value and which lies on the left side with respect to a position at which the light intensity is maximum in a light intensity distribution AI1 formed by the measurement pattern 12 during exposure in a stationary state, as shown in FIG. 8B.

The output results obtained by the measurement units 20A and 20B will be considered herein. First, let I1(x) and I2(x) be the light intensities measured by the measurement units 20A and 20B, respectively.

Figure 9:
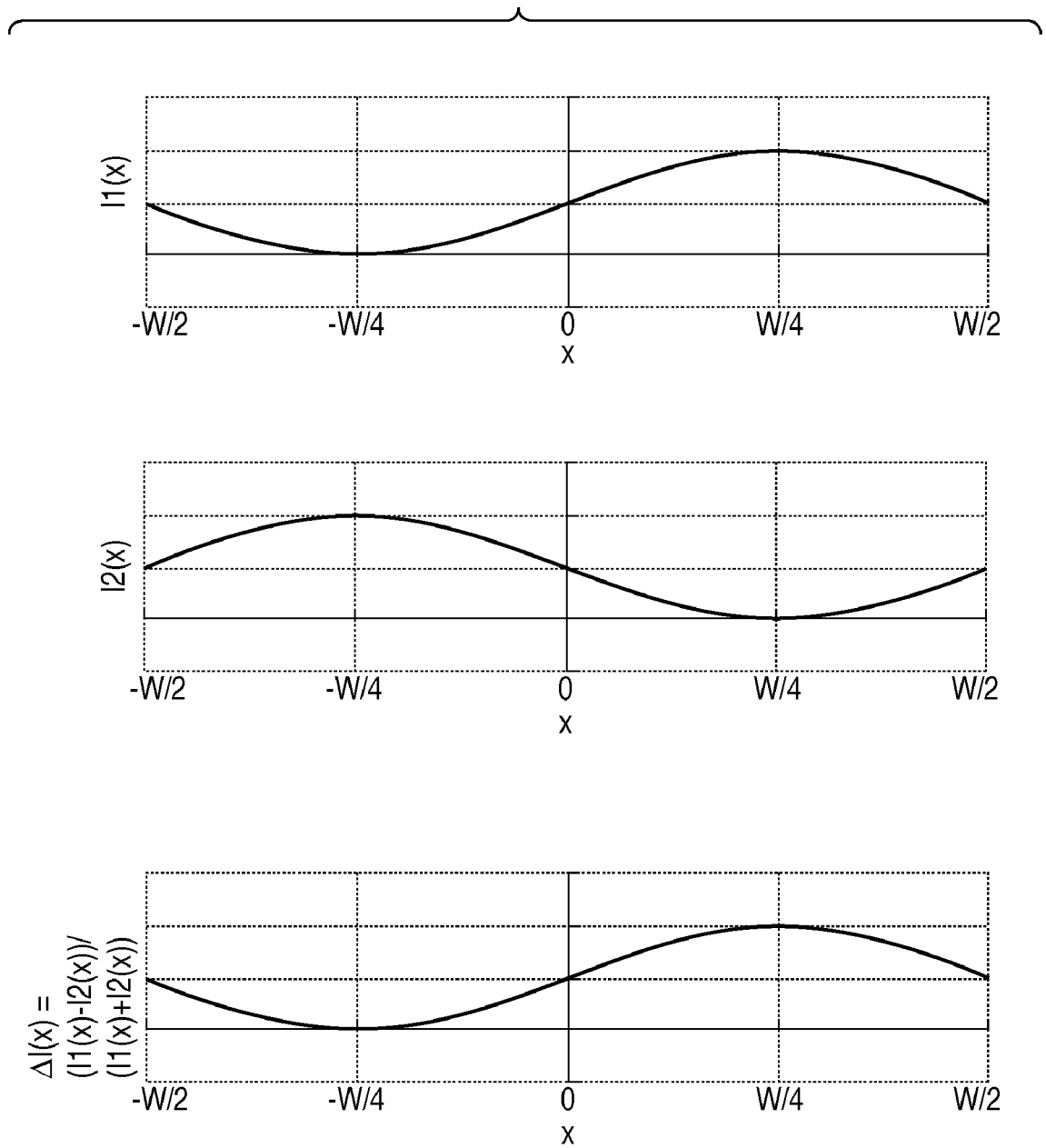
FIG. 9 is a graph illustrating an example of the light intensities measured by the two first measurement units and the analysis result using these measurement results.

For example, a case in which the light intensity distribution AI1 is displaced to the right at a constant speed will be considered. The measurement units 20A and 20B measure light intensities I1(x) and I2(x) represented by a graph in which the abscissa indicates a position x of the light intensity distribution, and the ordinate indicates a measured light intensity I(x), as shown in FIG. 9. Note that FIG. 9 is a graph illustrating an example of the light intensities I1(x) and I2(x) measured by the measurement units 20A and 20B.

The light intensity I1(x) measured by the measurement unit 20A will be considered first. When the position x is zero, the light intensity I1(x) is half its maximum value. As the position x of the optical image distribution moves to the right, the light intensity I1(x) increases. When the position x has reached W/4, the light intensity I1(x) becomes maximal. Then, the light intensity I1(x) decreases as the position x further moves to the right. When the position x has reached W/2, the light intensity I1(x) becomes half its maximum value. Conversely, as the position x of the optical image distribution moves to the left, the light intensity I1(x) decreases. When the position x has reached −W/4, the light intensity I1(x) becomes minimal. Then, the light intensity I1(x) increases as the position x further moves to the left. When the position x has reached −W/2, the light intensity I1(x) becomes half its maximum value.

The light intensity I2(x) measured by the measurement unit 20B will be considered next. When the position x is zero, the light intensity I2(x) is half its maximum value. As the position x of the optical image distribution moves to the right, the light intensity I2(x) decreases. When the position x has reached W/4, the light intensity I2(x) becomes minimal. Then, the light intensity I2(x) increases as the position x further moves to the right. When the position x has reached W/2, the light intensity I2(x) becomes half its maximum value. Conversely, as the position x of the optical image distribution moves to the left, the light intensity I2(x) increases. When the position x has reached −W/4, the light intensity I2(x) becomes maximal. Then, the light intensity I2(x) decreases as the position x further moves to the left. When the position x has reached −W/2, the light intensity I2(x) becomes half its maximum value.

ΔI(x) will be considered herein. Using the light intensities I1(x) and I2(x), ΔI(x) is defined as:

$$\Delta I(x) = (I1(x) - I2(x))/(I1(x) + I2(x))$$

As can be seen from this equation, ΔI(x) is a value which is not influenced by, for example, fluctuations in the measured light amounts because the difference between the measured light amounts is normalized by the sum of them.

When the position x is zero, ΔI(x) is zero. As the position x of the optical image distribution moves to the right, ΔI(x) increases. When the position x has reached W/4, ΔI(x) becomes maximal. Then, ΔI(x) decreases as the position x further moves to the right. When the position x has reached W/2, ΔI(x) becomes zero. Conversely, as the position x of the optical image distribution moves to the left, ΔI(x) decreases. When the position x has reached −W/4, ΔI(x) becomes minimal. Then, ΔI(x) increases as the position x further moves to the left. When the position x has reached −W/2, ΔI(x) becomes zero.

Referring to FIG. 4, if ΔI(x) is positive, this means the light intensity distribution is displaced to the right. Conversely, if ΔI(x) is negative, this means the light intensity distribution is displaced to the left.

Since the light intensities I1(x) and I2(x) are parameters which change over time, the parameters measured in the above-mentioned way can be rewritten as I1(x, t), I2(x, t), and ΔI(x, t). Since the measurement is performed while the reticle stage is scanned and the substrate stage is fixed in position in this embodiment, we have:

$$\begin{pmatrix} dZer_4 \\ \vdots \\ dZer_{36} \end{pmatrix} = \begin{pmatrix} dR_4 & dW_4 \\ \vdots & \vdots \\ dR_{36} & dW_{36} \end{pmatrix} \begin{pmatrix} def_R \\ 0 \end{pmatrix}' \quad (2)$$

That is, a displacement of the optical image occurs on the scanning image plane of the reticle stage with respect to the substrate stage, and the scanning image plane of the reticle stage with respect to the substrate stage can be calculated from the displacement amount of the light intensity distribution or the amount of change in the light intensity accompanying it. The scanning image plane of the substrate stage with respect to the reticle stage can be calculated while the reticle stage is fixed in position and the substrate stage is scanned, as in the above-mentioned series of measurement operations.

Figure 10:
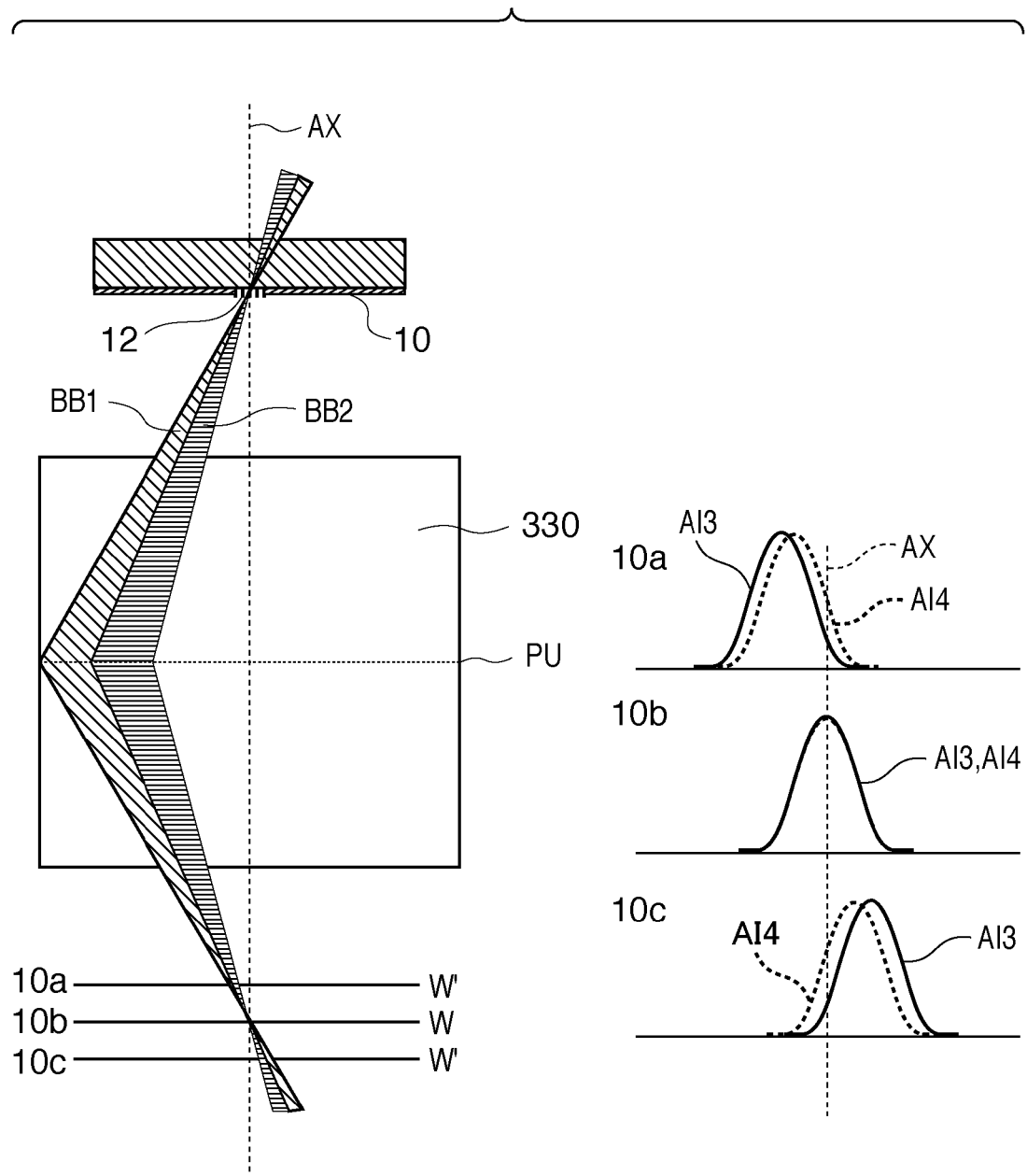
FIG. 10 is a view illustrating an example of the illumination states in which the measurement pattern is irradiated, and the light intensity distributions in these states.
Figure 11:
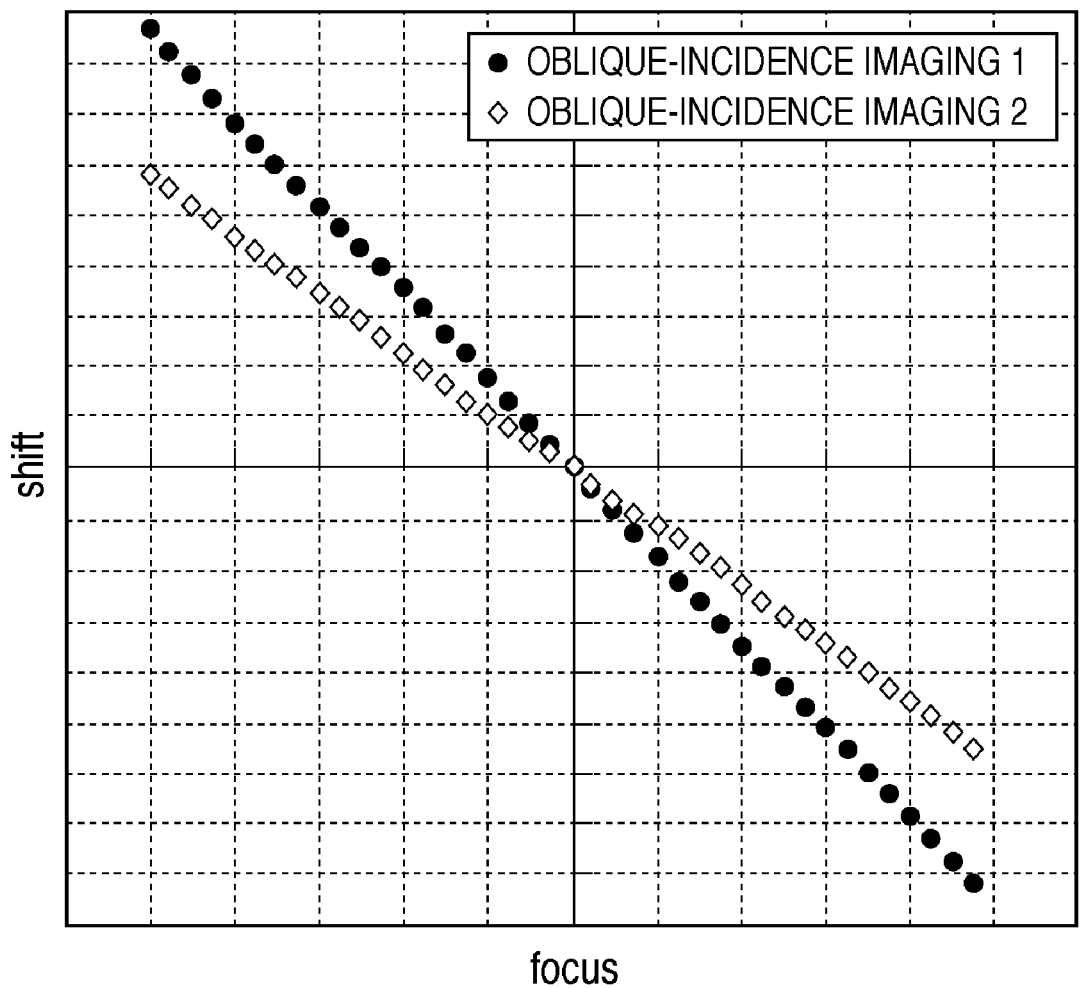
FIG. 11 is a graph schematically showing a correlation between displacements of the light intensity distributions in the illumination states shown in FIG. 10, and the defocus amount.

Measurement of the scanning image plane when both the reticle stage and the substrate stage are scanned will be described below. To measure the scanning image plane while both the stages are scanned, the above-mentioned measurement is performed by imaging the measurement pattern 12 included in the measurement mask 10 by at least two or more types of obliquely incident light beams (e.g., two or more types of illumination modes). FIG. 10 is a schematic view showing this measurement state. The displacement amount of the optical image for each defocus amount differs between light intensity distributions AI3 and AI4 formed by imaging the measurement pattern 12 by different obliquely incident light beams. FIG. 11 schematically shows correlations between the defocus amount and the displacement amount.

A displacement amount $S_1$ of the optical image of the YAMATO mark upon imaging the measurement pattern 12 by the first obliquely incident light, and a displacement amount $S_2$ of the optical image of the YAMATO mark upon imaging the measurement pattern 12 by the second obliquely incident light are described by:

$$S_1 = (Zer_{4\_1} \ldots Zer_{36\_1}) \left( \begin{pmatrix} c4 \\ \vdots \\ c36 \end{pmatrix} + \begin{pmatrix} dR_4 & dW_4 \\ \vdots & \vdots \\ dR_{36} & dW_{36} \end{pmatrix} \begin{pmatrix} def_R \\ def_W \end{pmatrix} \right)$$

$$= (Zer_{4\_1} \ldots Zer_{36\_1}) \begin{pmatrix} c4 \\ \vdots \\ c36 \end{pmatrix} +$$

$$(Zer_{4\_1} \ldots Zer_{36\_1}) \begin{pmatrix} dR_4 & dW_4 \\ \vdots & \vdots \\ dR_{36} & dW_{36} \end{pmatrix} \begin{pmatrix} def_R \\ def_W \end{pmatrix}$$

$$= Sc1 + A1 * \begin{pmatrix} def_R \\ def_W \end{pmatrix}$$

$$= Sc1 + Sd1$$

$$S_2 = (Zer_{4\_2} \ldots Zer_{36\_2}) \left( \begin{pmatrix} c4 \\ \vdots \\ c36 \end{pmatrix} + \begin{pmatrix} dR_4 & dW_4 \\ \vdots & \vdots \\ dR_{36} & dW_{36} \end{pmatrix} \begin{pmatrix} def_R \\ def_W \end{pmatrix} \right)$$

$$= Sc2 + A2 * \begin{pmatrix} def_R \\ def_W \end{pmatrix}$$

$$= Sc2 + Sd2$$

As long as the initial aberration amount Ci is given, it is possible to calculate Scj and, in turn, calculate Sdj from Scj. This yields a scan defocus amount upon simultaneously driving the reticle stage and the substrate stage:

$$\begin{pmatrix} def_R \\ def_W \end{pmatrix} = \begin{pmatrix} A1 \\ A2 \end{pmatrix}^{-1} \begin{pmatrix} Sd1 \\ Sd2 \end{pmatrix}$$

Figure 12:
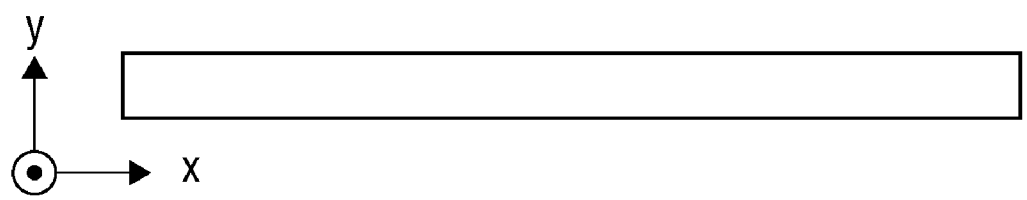
FIG. 12 is a view illustrating an example of an illumination region which illuminates a reticle.

In a scanning exposure apparatus, an illumination region SR which illuminates a reticle is a rectangle, as shown in FIG. 12. The longitudinal direction of the illumination region SR is assumed to be the x direction, and its widthwise direction is assumed to be the y direction. Note that FIG. 12 is a view illustrating an example of an illumination region SR which illuminates a reticle.

Figure 15:
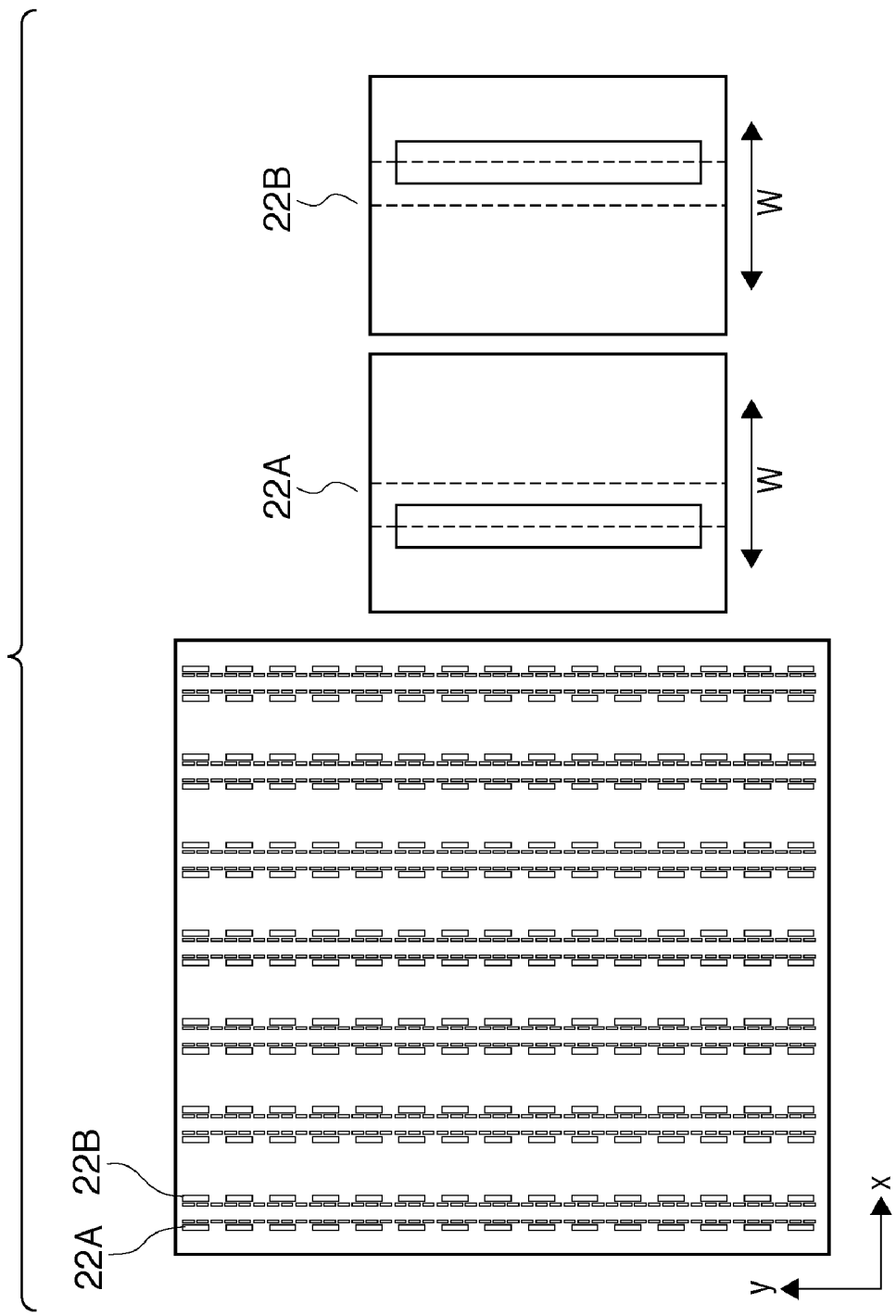
FIG. 15 is a view illustrating an example of a state in which sets of openings are arranged in correspondence with respective angles of view in the exposure region.
Figure 16:
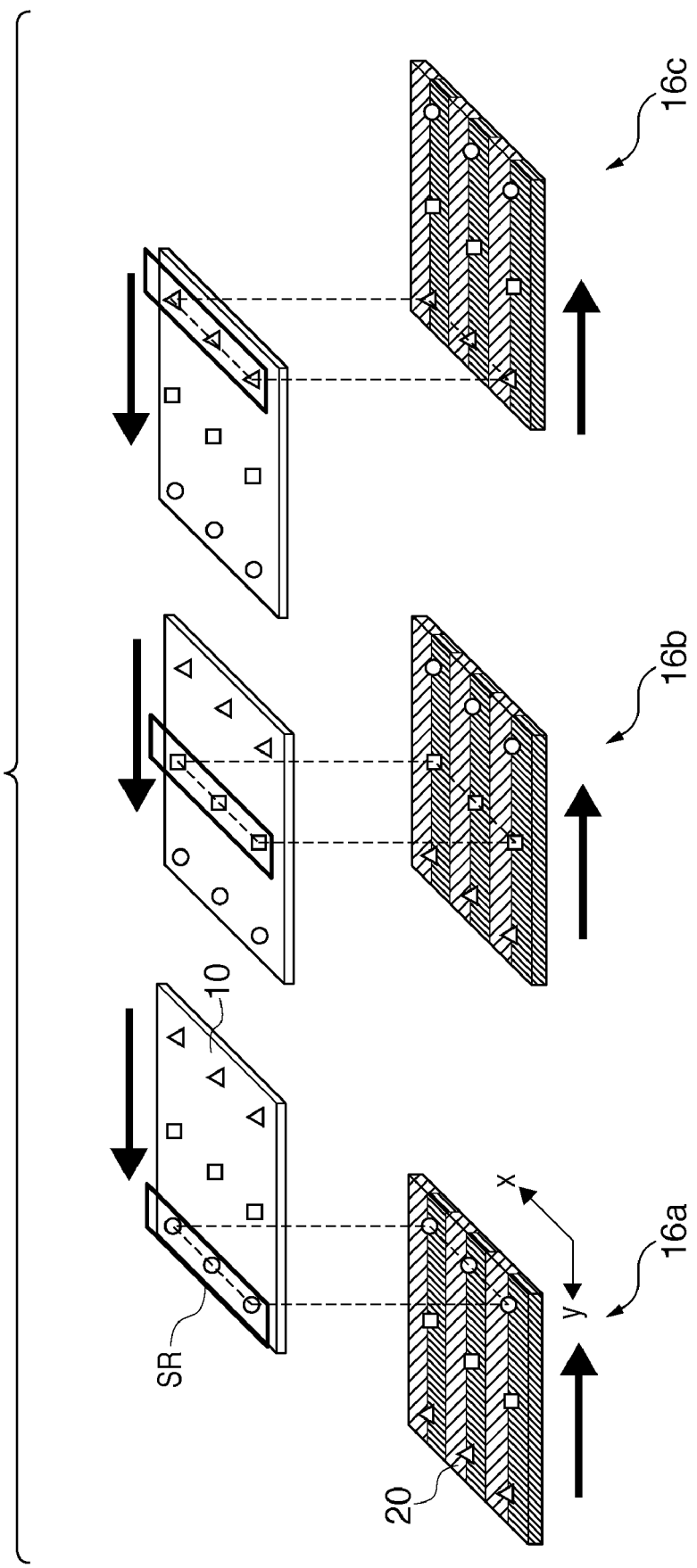
FIG. 16 is a view illustrating an example of measurement using the measurement mask and first measurement units shown in FIGS. 13 to 15.

A scanning exposure apparatus transfers the pattern of a reticle onto a substrate by exposure by continuously scanning them in the y direction. To measure the scan defocus amount over the entire exposure region, a measurement mask 10 and first measurement units 20 need only be arranged, for example, as shown in FIGS. 13 to 16. In this case, it is possible to measure the scan defocus amounts at respective angles of view at once. FIG. 13 is a view showing a state in which YAMATO marks are arranged at distances along the same image heights. FIG. 14 is a view showing a state in which two measurement units 20A and 20B each are arranged in a plurality of portions (in FIG. 14, seven portions) in the illumination region SR along the x direction with a dimension, in the y direction, which is equal to or longer than that of the scan region. FIG. 15 is a view showing two openings 22A and 22B accompanying two measurement units 20A and 20B. These arrangements are merely examples, and the YAMATO mark or the slit may be a continuous long pattern or may take another form. When a plurality of measurement patterns 12 corresponding to respective first measurement units are arranged on the measurement mask 10 in both the x and y directions, as shown in FIG. 16, it is possible to measure the amount of change in the scan defocus amount over the entire exposure region at once.

When first measurement units 20 having relatively large sizes, as shown in FIG. 14, are manufactured, it is necessary to strictly make uniform the evennesses of identical first measurement units 20 or correct them using evenness data in advance. This is because, when a difference in evenness occurs among identical first measurement units 20, the evennesses of identical first measurement units 20 are added to a defocus amount, which is a measurement target, as a measurement error of the defocus amount. This makes it impossible to precisely measure the scan defocus amount.

Figure 17:
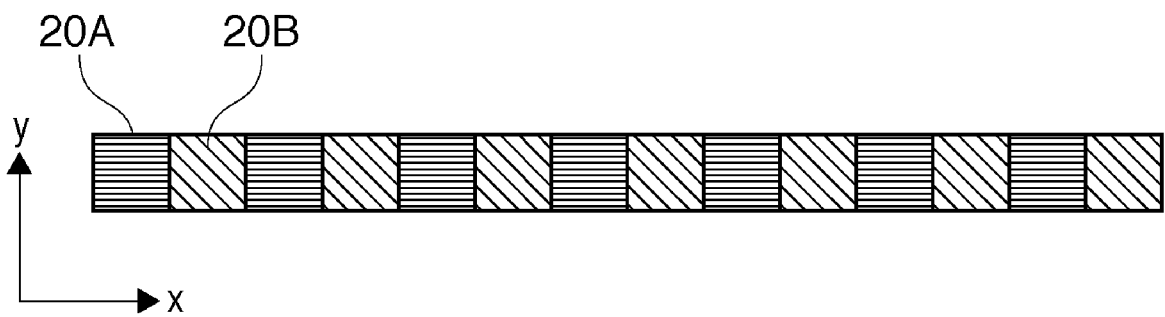
FIG. 17 is a view illustrating an example of a state in which sets of first measurement units are arranged in correspondence with respective angles of view in the x direction.
Figure 18:
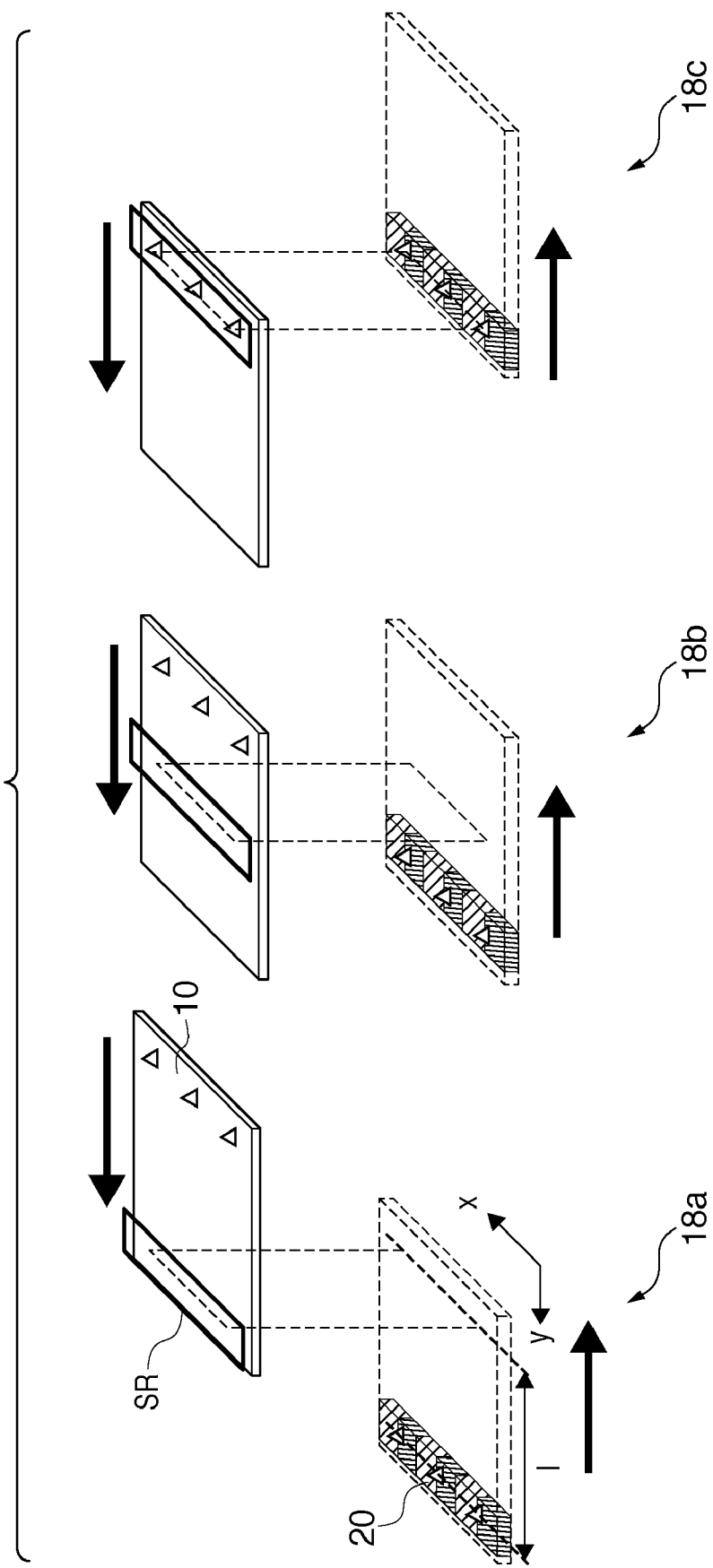
FIG. 18 is a view illustrating an example of measurement using the first measurement units shown in FIG. 17.

To precisely measure the defocus amount in the scanning direction even if the evennesses of identical first measurement units 20 cannot be uniformed, it is only necessary to downsize the first measurement units 20, as shown in FIG. 17, and measure the scan defocus amounts at all angles of view in the same portion, thereby preventing any changes in the evennesses. This makes it possible to eliminate any errors attributed to the evennesses. FIG. 18 shows a state in which the scan defocus amount over the entire exposure region is measured using first measurement units 20 as shown in FIG. 17. In this case as well, measurement patterns 12C corresponding to respective angles of view are arranged on the measurement mask 10. ρ marks in FIG. 18 indicate the measurement patterns 12C on the measurement mask 10. Reference symbols 18a and 18c are views showing the scanning start position and the measurement of the measurement image height, respectively. Assuming that the distance from the mask center to the measurement pattern 12C is −1× (apparatus magnification), a stage position which becomes conjugate to the position of the measurement patterns 12C as they pass through the illumination region SR is +1. In view of this, when the first measurement units 20 are arranged at a driving start position 1, as shown in reference symbol 18a, and scanning is started, it is possible to measure the light intensity at a stage position conjugate to the position of the measurement patterns 12C, as shown in reference symbol 18c, without measuring the displacement amount at an image height which does not match a position conjugate to the position of the measurement patterns 12C as shown in reference symbol 18b. This makes it possible to measure the scan defocus amount at a targeted image height. In this manner, the scan defocus amounts at all angles of view can be measured by scanning the stages a plurality of times using an offset of the driving start position corresponding to each angle of view.

Because the displacement amount of the optical image distribution is measured in this measurement method, the amount of displacement of the optical image attributed to defocus and a synchronization error between the reticle stage and the substrate stage are expected to be measured simultaneously. To handle this situation, a method of separating a defocus component and a synchronization error component between the reticle stage and the substrate stage will be described below.

A displacement amount Ssl(x) of the optical image distribution when obliquely incident light is used, a displacement amount Sdef(x) of the optical image distribution attributed to defocus, and a displacement amount Sdist(s) of the optical image distribution attributed to the generation of a synchronization error between the reticle stage and the substrate stage satisfy a relation:

$$Ssl(x)=Sdef(x)+Sdist(s)$$

The displacement amount of the light intensity distribution is measured under a measurement condition under which no displacement of the light intensity distribution attributed to defocus occurs when the reticle stage and the substrate stages are scanned in synchronism with each other. For example, when symmetrical illumination light is used for the measurement pattern 12 of the measurement mask 10, a light intensity distribution is formed free from any displacement attributed to defocus. Hence, the measured displacement amount of the light intensity distribution is Sdist(x).

Light intensities I1sl and I2sl measured by the measurement units 20A and 20B, respectively, when obliquely incident light is used, and light intensities I1dist and I2dist measured by the measurement units 20A and 20B, respectively, when symmetrical illumination light is used satisfy the relationships:

$$\Delta Isl=(I1sl-I2sl)/(I1sl+I2sl)$$

$$\Delta Idist=(I1dist-I2dist)/(I1dist+I2dist)$$

The displacement amounts of the light intensity distributions attributed to the respective factors can be seen from the above-mentioned values. Then, we have:

$$Ssl(x)-Sdist(x)=Sdef(x)$$

This makes it possible to separate a defocus component and a component attributed to a synchronization error between the reticle stage and the substrate stage.

Second Embodiment

A measurement method using two types of measurement patterns 12 and two types of first measurement units 20 has been described above. A measurement method using at least one sensor as a second measurement unit which monitors the light amount will be described next.

Figure 19:
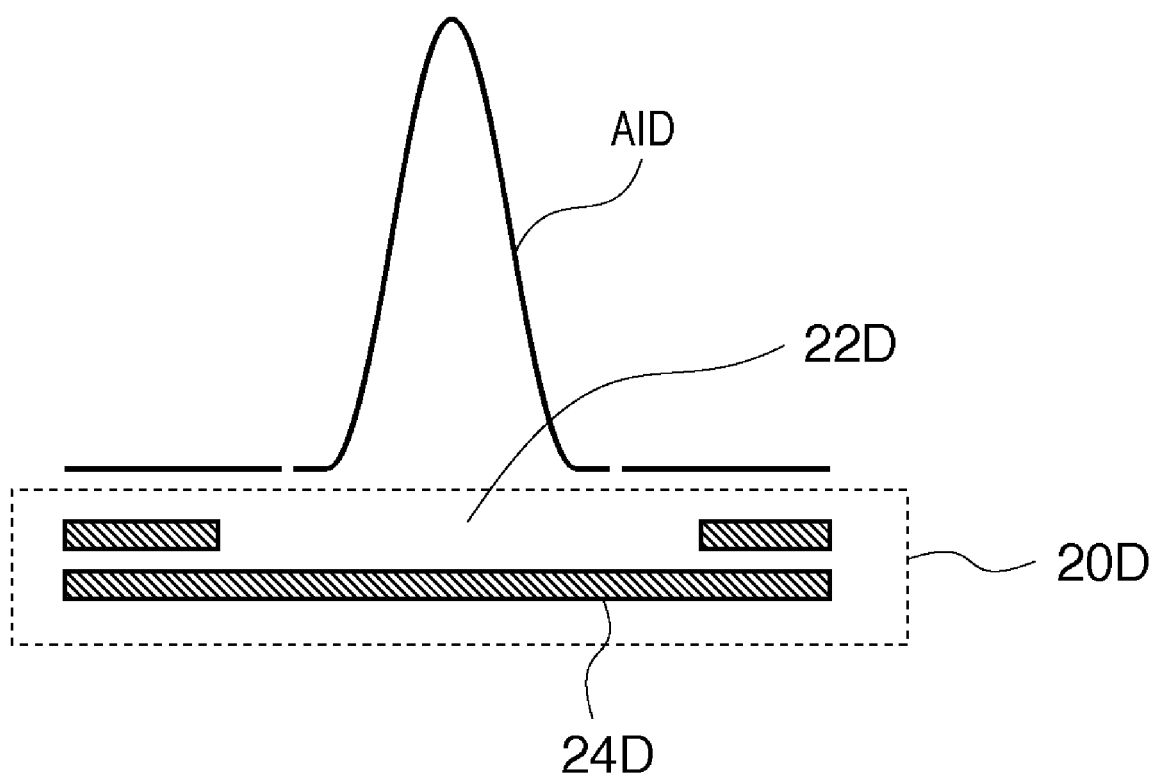
FIG. 19 is a view illustrating an example of a second measurement unit for light amount monitoring.
Figure 20A:
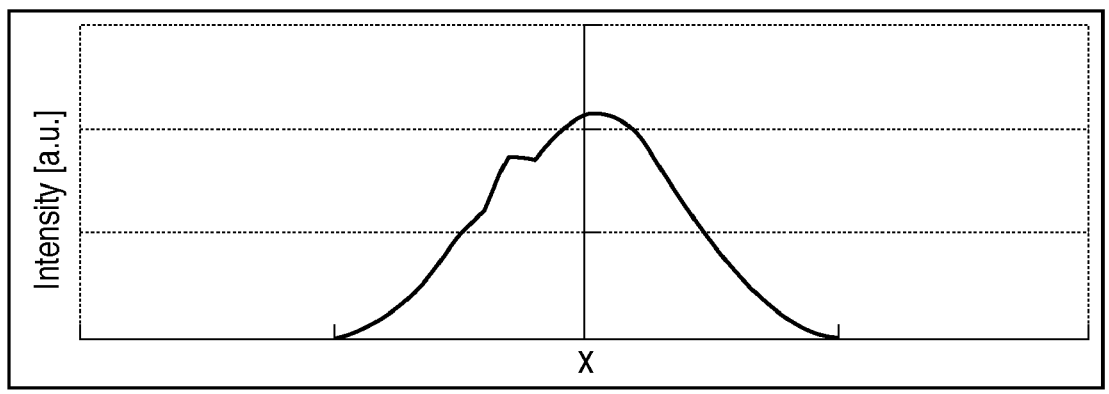
FIG. 20A is a graph showing the light intensity corrected by a variation in the light amount.
Figure 20B:
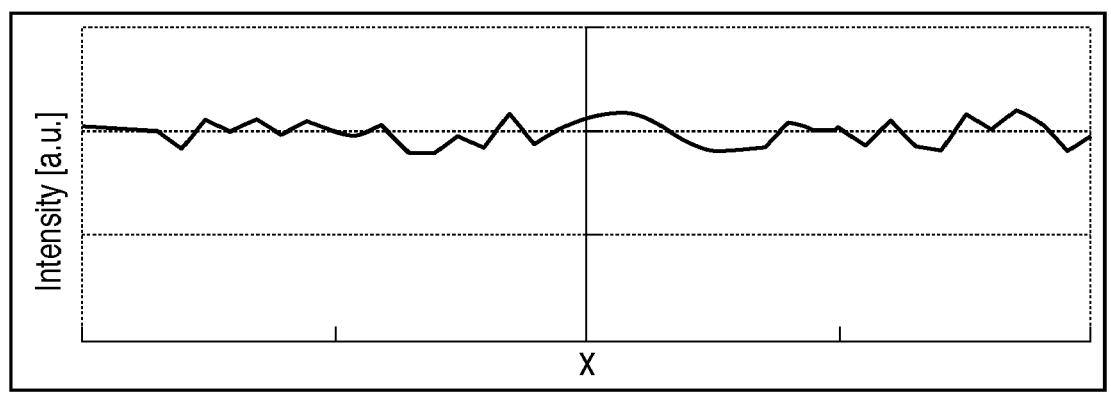
FIG. 20B is a graph showing the light intensity corrected by a variation in the light amount.
Figure 20C:
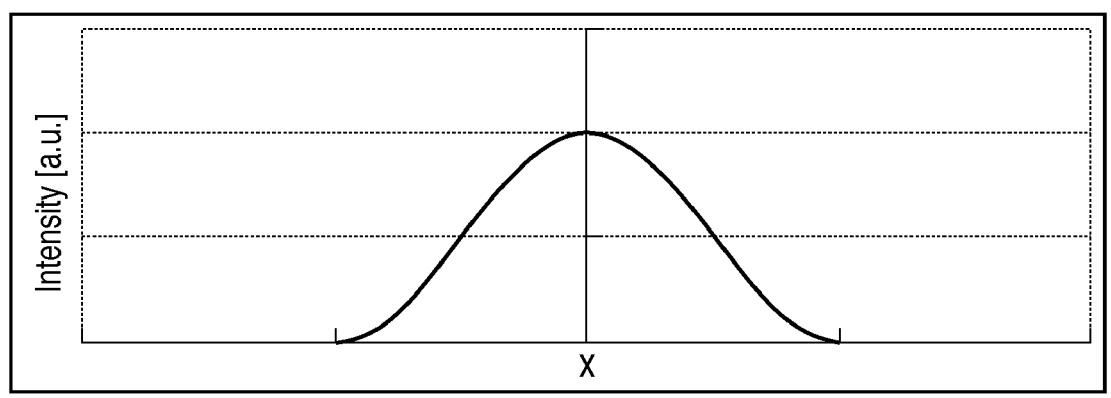
FIG. 20C is a graph showing the light intensity corrected by a variation in the light amount.

Two or more measurement masks 10 and measurement units are provided for light amount monitoring and defocus measurement. A measurement mask 10C and first measurement unit 20C for defocus measurement may have the same configurations as in the first embodiment. For example, a YAMATO mark with a width W and a period PP is arranged as a measurement pattern 12 as in FIG. 8A. The first measurement unit 20C is arranged on the substrate stage at a position conjugate to that of the measurement mask 10C, and has openings 22C each of which is arranged at nearly a position W/4 at which the light intensity is half its maximum value. A measurement mask 10D and second measurement unit 20D which measure light amounts that stay constant when the reticle stage and the substrate stage are scanned are provided for light amount monitoring. For example, as shown in FIG. 19, the measurement mask 10D includes an ISO space mark arranged on it, and an opening 22D having a size large enough to trap all light beams even when the light intensity distribution is displaced due to, for example, defocus with respect to a light intensity distribution formed by the measurement pattern 12. The relationship between the position and the light intensity in the first measurement mask is acquired by moving the first measurement unit 20C within the range of at least from −W/2 to W/2 during exposure in a stationary state, as in the calibration (FIG. 20A). At this time, the amount of light from the measurement pattern 12, which is measured by the second measurement unit 20D, does not change due to defocus or a displacement because the second measurement unit 20D is moved in a direction perpendicular to the slit direction. If the second measurement unit 20D has measured a fluctuation in the light amount, it is attributed to the illumination light amount (FIG. 20B). By normalizing the light amount measurement result obtained by the first measurement unit 20C by that obtained by the second measurement unit 20D, a correlation between a displacement of the light intensity distribution and the intensity measured by the first measurement unit 20C, in which a fluctuation in the illumination light amount is corrected, can be obtained (FIG. 20C).

By exploiting this relationship, the first measurement unit 20C is arranged at the angle of view at which the defocus amount is to be measured, and the second measurement unit 20D is arranged to be able to monitor the illumination light amount at the same timing. When the measurement result obtained by the first measurement unit 20C is normalized by that obtained by the second measurement unit 20D, it is possible to convert the intensity measured by the first measurement unit 20C into a displacement amount of the light intensity distribution by the above-mentioned procedure, thus calculating the defocus amount.

Third Embodiment

In the third embodiment, a first measurement unit 20 including a light-shielding plate SB and light intensity sensor 24 is provided and used for a light intensity distribution AI formed by a measurement pattern 12 of a measurement mask 10. The light-shielding plate SB has openings 22 which are formed by small slits. The light intensity sensor 24 is arranged under the openings 22.

Measurement of the scan defocus amount when two measurement masks 10 and three first measurement units 20 are used will be described below. In the following description, the two measurement masks 10 will be referred to as measurement masks 10E and 10F, and the three first measurement units 20 will be referred to as measurement units 20E, 20F, and 20G.

Figure 21A:
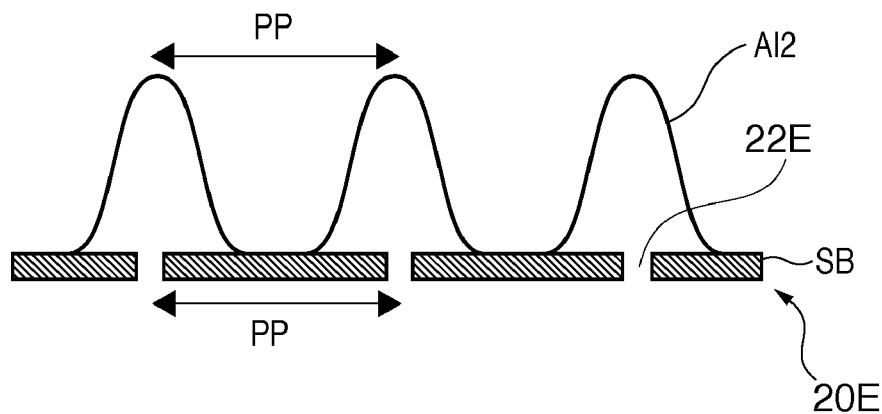
FIG. 21A is a view showing the positional relationship between a light intensity distribution formed by a measurement pattern, and openings of a first measurement unit.
Figure 21B:
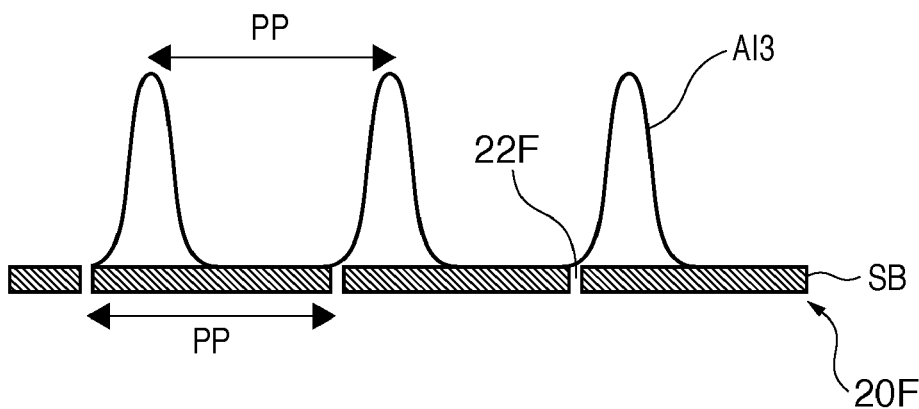
FIG. 21B is a view showing the positional relationship between a light intensity distribution formed by a measurement pattern, and openings of a first measurement unit.
Figure 21C:
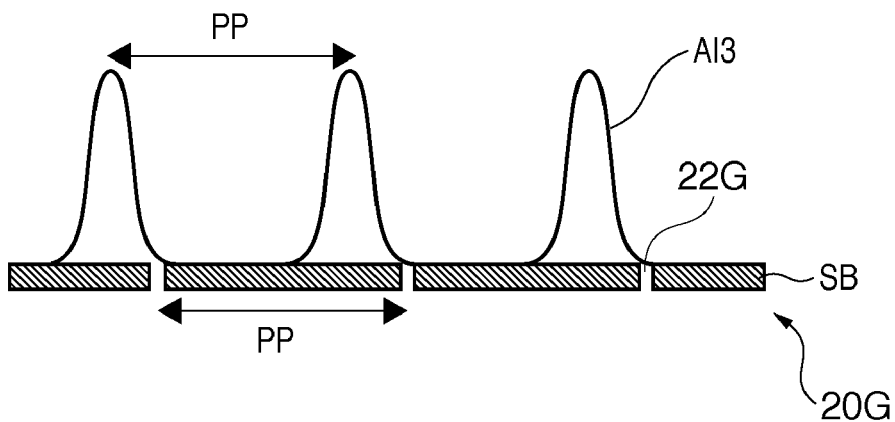
FIG. 21C is a view showing the positional relationship between a light intensity distribution formed by the measurement pattern, and openings of a first measurement unit.

A measurement pattern 12E of the measurement mask 10E is a repetitive pattern which has a period PP and is formed by a YAMATO mark, and forms a sinusoidal light intensity distribution AI2 with the period PP, as shown in FIG. 21A. A measurement pattern 12F of the measurement mask 10F is a pattern which has a period PP and is formed by a YAMATO mark as well, but forms a light intensity distribution AI3 in which the light intensity is nearly zero in a region corresponding to a half of the period PP, as shown in FIG. 21B or 21C. Note that FIG. 21A is a view showing the positional relationship between a light intensity distribution AI2 formed by the measurement pattern 12E of the measurement mask 10E, and openings 22E of the measurement unit 20E. FIG. 21B is a view showing the positional relationship between a light intensity distribution AI3 formed by the measurement pattern 12F of the measurement mask 10F, and openings 22F of the measurement unit 20F. FIG. 21C is a view showing the positional relationship between a light intensity distribution AI3 formed by the measurement pattern 12F of the measurement mask 10F, and openings 22G of the measurement unit 20G.

The measurement units 20E to 20G each include a light-shielding plate SB and light intensity sensor 24. The light-shielding plates SB have openings 22E to 22G which are formed by small slits and have a period PP. The light intensity sensors 24 include photodetectors and are arranged under the openings 22E to 22G. The widths of the openings 22E to 22G can be equal to or narrower than PP/4. In the measurement unit 20E, the openings 22E are parallel to the measurement pattern 12E of the measurement mask 10E, and the direction in which the openings 22E are repeated is the same as that in which the lines and spaces of the measurement pattern 12E are repeated. Likewise, in the measurement units 20F and 20G, the openings 22F and 22G are parallel to the measurement pattern 12F of the measurement mask 10F, and the directions in which the openings 22F and 22G are repeated are the same as that in which the lines and spaces of the measurement pattern 12F are repeated.

The measurement unit 20E is arranged such that the openings 22E each are positioned at a position at which the light intensity is maximal in a light intensity distribution AI2 formed by the measurement pattern 12E during exposure in a stationary state, as shown in FIG. 21A. The measurement unit 20F is arranged such that the openings 22F each are positioned at a position at which the light intensity is nearly zero and which lies on the left side with respect to a position at which the light intensity is maximal in a light intensity distribution AI3 formed by the measurement pattern 12F during exposure in a stationary state, as shown in FIG. 21B. The measurement unit 20G is arranged such that the openings 22G each are positioned at a position at which the light intensity is nearly zero and which lies on the right side with respect to a position at which the light intensity is maximal in a light intensity distribution AI3 formed by the measurement pattern 12F during exposure in a stationary state, as shown in FIG. 21C.

The output results obtained by the measurement units 20E to 20G will be considered herein. Let $I1(t)$, $I2(t)$, and $I3(t)$ be the light intensities measured by the measurement units 20E, 20F, and 20G, respectively.

Figure 22:
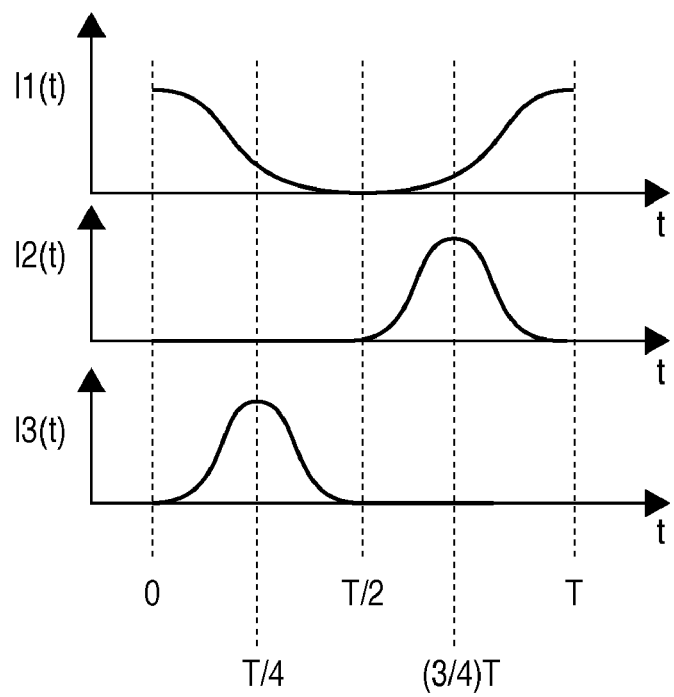
FIG. 22 is a graph illustrating an example of the light intensities measured by the three first measurement units shown in FIGS. 21A to 21C.

For example, a case in which the light intensity distributions AI2 and AI3 are displaced to the right from zero to PP at a constant speed will be considered. Let T be the time taken for the light intensity distributions AI2 and AI3 to be displaced from zero to PP. The measurement units 20E to 20G measure light intensities $I1(t)$ to $I3(t)$ represented by a graph in which the abscissa indicates a time t, and the ordinate indicates a measured light intensity I(t), as shown in FIG. 22. Note that FIG. 22 is a graph illustrating an example of the light intensities $I1(t)$ to $I3(t)$ measured by the measurement units 20E to 20G.

The light intensity $I1(t)$ measured by the measurement unit 20E will be considered first. When the time t is zero, the light intensity $I1(t)$ is maximal. As the time t progresses, the light intensity $I1(t)$ decreases. When the time t has reached T/2, the light intensity $I1(t)$ becomes zero. Then, the light intensity $I1(t)$ increases as the time t further progresses. When the time t has reached T, the light intensity $I1(t)$ becomes maximal.

The light intensity $I2(t)$ measured by the measurement unit 20F will be considered next. When the time t is equal to or less than T/2, the light intensity $I2(t)$ is zero. When the time t exceeds T/2, the light intensity $I2(t)$ increases. When the time t has reached T×(3/4), the light intensity $I2(t)$ becomes maximal. When the time t exceeds T×(3/4), the light intensity $I2(t)$ decreases. When the time t has reached T, the light intensity $I2(t)$ becomes zero.

The light intensity $I3(t)$ measured by the measurement unit 20G will be considered lastly. When the time t is equal to or less than T/4, the light intensity $I3(t)$ increases. When the time t has reached T/4, the light intensity $I3(t)$ becomes maximal. When the time t exceeds T/4, the light intensity $I3(t)$ decreases. When the time t becomes equal to or more than T/2, the light intensity $I3(t)$ becomes zero.

Figure 23:
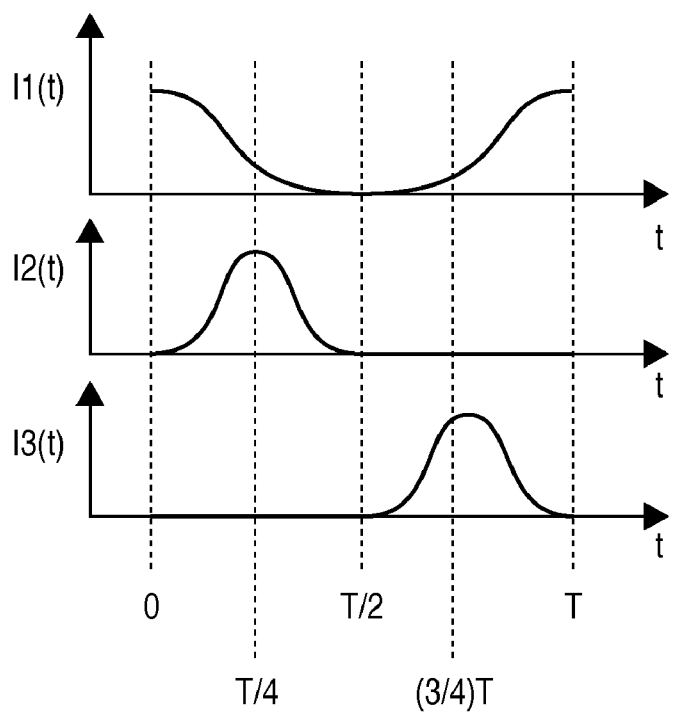
FIG. 23 is a graph illustrating another example of the light intensities measured by the three first measurement units shown in FIGS. 21A to 21C.

If the light intensity distributions AI2 and AI3 are displaced to the left from zero to PP at a constant speed, the measurement units 20E to 20G measure light intensities $I1(t)$ to $I3(t)$ as shown in FIG. 23. Note that FIG. 23 is a graph illustrating an example of the light intensities $I1(t)$ to $I3(t)$ measured by the measurement units 20E to 20G.

Referring to FIGS. 22 and 23, if a derivative $dI1(t)/dt$ obtained by differentiating the light intensity $I1(t)$ with respect to time is negative, a change in the light intensity I2(t) amounts to a displacement of the light intensity distribution to the left. Likewise, if a derivative dI1(t)/dt obtained by differentiating the light intensity I1(t) with respect to time is positive, a change in the light intensity I3(t) amounts to a displacement of the light intensity distribution to the left. If a derivative dI1(t)/dt obtained by differentiating the light intensity I1(t) with respect to time is negative, a change in the light intensity I3(t) amounts to a displacement of the light intensity distribution to the right. Likewise, if a derivative dI1(t)/dt obtained by differentiating the light intensity I1(t) with respect to time is positive, a change in the light intensity I2(t) amounts to a displacement of the light intensity distribution to the right.

In this manner, the displacement amount of the light intensity distribution can be calculated by analyzing the outputs from the measurement units 20E to 20G and their temporal changes, that is, by differentiating a light intensity represented as a function of time with respect to time.

As long as the displacement amount of the light intensity distribution can be calculated, the scan defocus amount can be calculated based on the relationship between the displacement amount of the light intensity distribution and the defocus amount.

Alignment calibration using the measurement units 20E to 20G is the same as in the first embodiment, and a description thereof will not be given herein.

To measure the scan defocus amounts at respective angles of view in the exposure apparatus, the same operation as in the first embodiment need only be performed in the third embodiment. The scan defocus amounts at respective angles of view can be measured at once by dividing an illumination region SR in the x direction into several regions (for example, it need only be divided into 11 regions), and arranging measurement masks 10 and first measurement units 20 in respective regions.

Figure 24A:
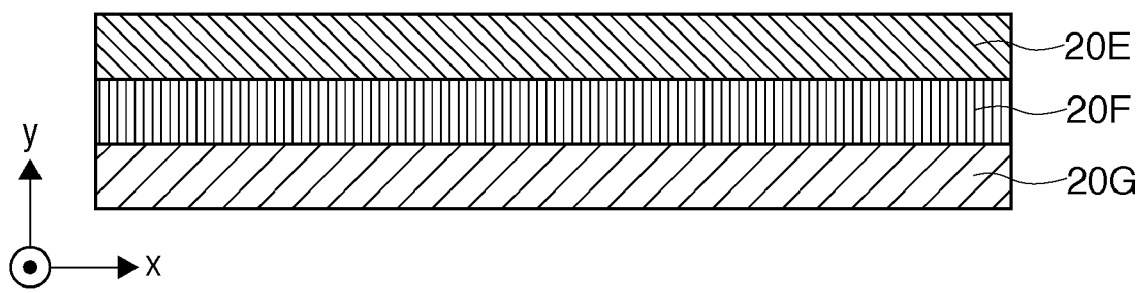
FIG. 24A is a view illustrating an example of a state in which sets of first measurement units are arranged in correspondence with respective angles of view.
Figure 24B:
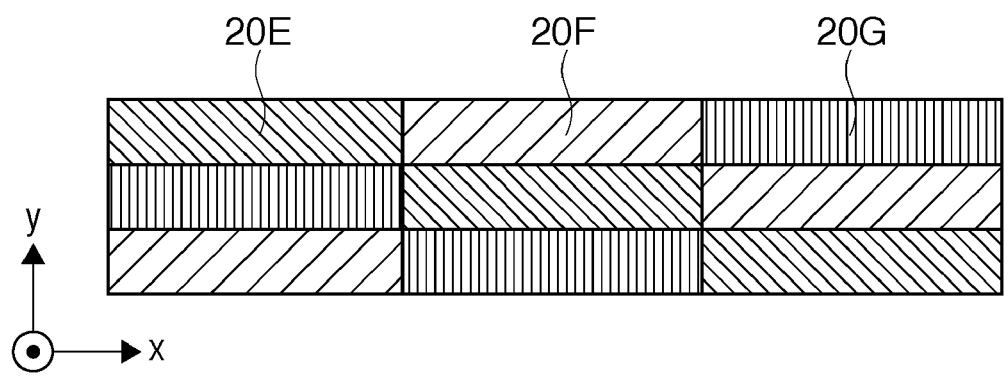
FIG. 24B is a view illustrating the example of a state in which sets of first measurement units are arranged in correspondence with respective angles of view.

FIG. 24A illustrates an example of a state in which sets of first measurement units (measurement units 20E to 20G) are arranged in correspondence with respective angles of view. The measurement units 20E to 20G can be arranged at the same angle of view, as shown in FIG. 24A. The arrangement of the first measurement units 20 shown in FIG. 24A is merely an example, and the measurement units 20E to 20G can be arranged in random order in the y direction. For example, the measurement units 20E to 20G may be arranged in a checkerboard pattern, as shown in FIG. 24B. Also, a combination of the measurement units 20E to 20G may be configured as a single measurement unit. Note that FIGS. 24A and 24B are views illustrating examples in which sets of first measurement units are arranged in correspondence with respective angles of view.

Fourth Embodiment

The defocus amount can be measured even by using a PSG (Phase Shift Grating) as a measurement mask 10 in the measurement methods as in the first to third embodiments. Japanese Patent Laid-Open No. 2002-55435, H. Nomura, "New phase shift gratings for measuring aberrations", SPIE, vol. 4346 (2001), pp. 25-35, and the like describe details of the PSG.

Figure 25:
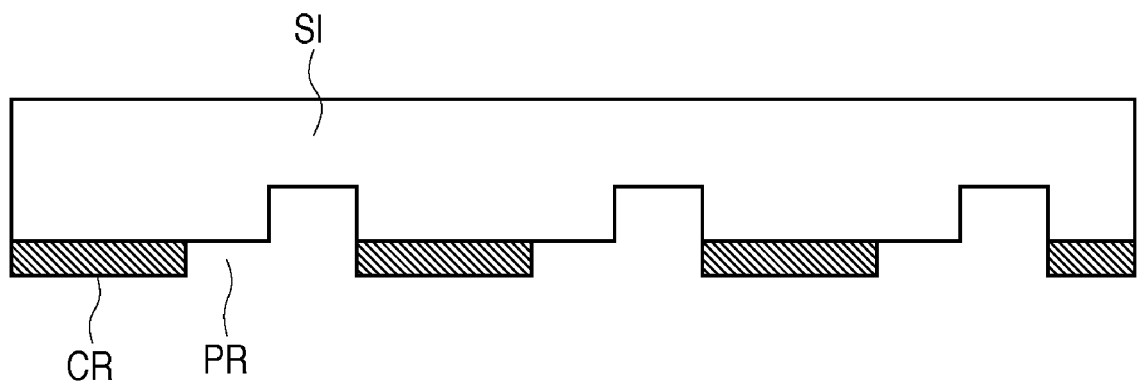
FIG. 25 is a view illustrating an example of a measurement pattern.
Figure 26:
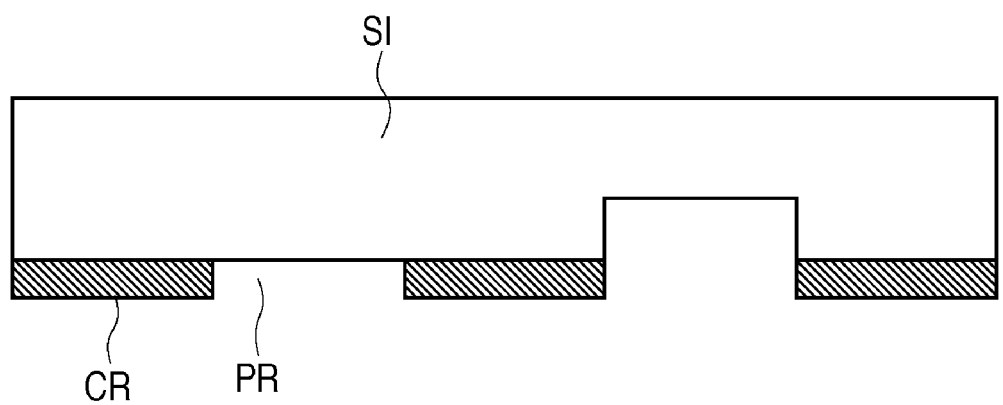
FIG. 26 is a view illustrating another example of the measurement pattern.

The techniques described in these references use two-beam interference to measure the phase difference between two different wavefront portions through which these light beams respectively propagate, thereby obtaining the optical characteristics. More specifically, a space portion (transparent portion) of an L&S mark on a mask shown in FIG. 25 is designed to have two different steps that are 90° out of phase with each other. When the L&S mark is illuminated under a normal, small-σ illumination condition, interference between the light beams diffracted by the L&S mark is two-beam interference between 0th- and +1st- or −1st-order diffracted light beams, instead of normal, three-beam interference between 0th- and ±1st-order diffracted light beams diffracted by an L&S mark using a binary mask. Note that, at this time, the pitch of the L&S mark satisfies the following condition. That is, a +1st- or −1st-order diffracted light beam diffracted by the L&S mark passes through an NA stop in a projection optical system, but other high-order diffracted light beams are eclipsed by the NA stop in the projection optical system and therefore do not contribute to imaging.

If the projection lens suffers wavefront aberration, the image formed by the two-beam interference is influenced by the phases of the wavefront portions through which the two light beams respectively propagate. If these light beams are out of phase with each other at this time, the position of the image shifts by the phase difference. It is therefore possible to calculate the defocus amount by detecting a positional shift of the image and the wavefront portions through which the light beams propagate.

A specific embodiment using the above-mentioned measurement method will be described below. An L&S pattern as shown in FIG. 25 is used as a measurement pattern 12 of a measurement mask 10, and is irradiated under a small-σ illumination condition. Letting λ be the wavelength of exposure light of a scanning exposure apparatus, and NA be the numerical aperture of a projection optical system, the pitch of the L&S pattern is assumed to be normalized by (λ/NA) to a period PP, which is 0.5 or less. In contrast, the pitch of openings 22 for measurement in a first measurement unit 20 is assumed to be PP/(apparatus magnification), and the sizes of the openings 22 are assumed to be PP/4. A change in the intensity of the optical image is measured using these measurement equipments while at least one of a reticle stage and a substrate stage is scanned as in the first to third embodiments. The measured change in intensity is analyzed by the methods according to the first to third embodiments to calculate the scan defocus amount of at least one of the reticle stage and the substrate stage or those of both of them.

In addition to a PSG, there exists a phase shift mask including a mark formed such that the left and right sides of one line pattern (light-shielding line) in the mark have a phase difference which is other than 0° and 180° and is typically 90°. This phase shift mask is called a PSFM (Phase Shift Focus Monitor) mask. A PSFM mask is commercially available and used as a focus monitor, as well as a PSG used as a phase shift mask. A displacement of a PSFM mask occurs due to the influence of aberration in principle, as well as a PSG used as a phase shift mask. However, because a PSFM mask causes interference using a single line (it typically has a line width near a resolution limit) differently from two-beam interference by a grating, light which is diffracted by this mask and scatters over the entire pupil plane of the projection lens causes a displacement of the image upon being influenced by the average aberration of the overall wavefront, so the sensitivity of this mask is relatively low. Although the scan defocus amount can be calculated in the same way as above even by using this mask, a detailed description thereof will not be given herein.

Figure 27:
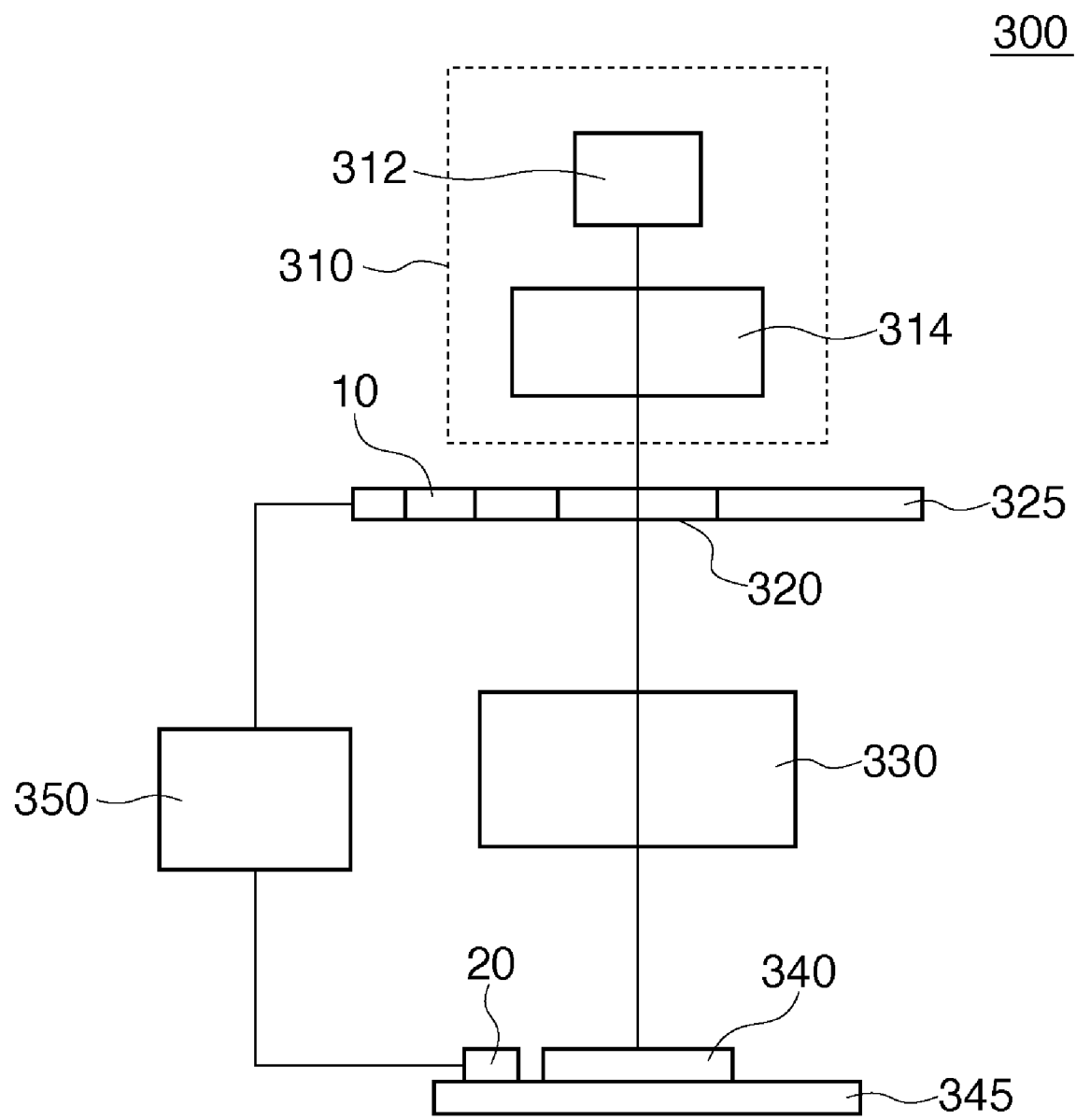
FIG. 27 is a view showing the arrangement of a scanning exposure apparatus.

An exposure apparatus which can measure the defocus amount according to the present invention will be explained below. FIG. 27 is a schematic sectional view illustrating an example of an exposure apparatus 300 according to the present invention. The exposure apparatus 300 is a scanning exposure apparatus which transfers the pattern of a reticle 320 onto a substrate 340 by exposure using the step & scan scheme. The exposure apparatus 300 includes an illumination device 310, a reticle stage 325 which supports the reticle 320 and a measurement mask 10, a projection optical system 330, a substrate stage 345 which supports the substrate 340 and a first measurement unit 20, and a controller 350. In the exposure apparatus 300, the measurement mask 10, the first measurement unit 20, and the controller 350 constitute a measurement apparatus 1 for executing the measurement method according to the present invention.

The illumination device 310 illuminates the measurement mask 10 and the reticle 320 on which a circuit pattern to be transferred is formed, and includes a light source unit 312 and illumination optical system 314.

The light source unit 312 uses, for example, an excimer laser as a light source. The excimer laser includes, for example, a KrF excimer laser having a wavelength of about 248 nm, and an ArF excimer laser having a wavelength of about 193 nm. However, the light source of the light source unit 312 is not limited to an excimer laser, and may be, for example, the i-line of a mercury lamp having a wavelength of about 365 nm.

The illumination optical system 314 illuminates the reticle 320 and the measurement mask 10, and includes, for example a lens, mirror, optical integrator, phase plate, diffractive optical element, and stop. The illumination optical system 314 has a function of illuminating the reticle 320 and the measurement mask 10 with a desired effective light source shape (i.e., dipole illumination, quadrupole illumination, or annular illumination).

The reticle 320 has a circuit pattern and is supported and driven by the reticle stage 325. Diffracted light generated by the reticle 320 is projected onto the substrate 340 via the projection optical system 330. Since the exposure apparatus 300 is a scanning exposure apparatus, it transfers the pattern of the reticle 320 onto the substrate 340 by scanning them.

The reticle stage 325 holds the reticle 320 and the measurement mask 10 and is connected to a driving mechanism (not shown). The driving mechanism (not shown) includes, for example, a linear motor, and can move the reticle 320 and the measurement mask 10 by driving the reticle stage 325.

The projection optical system 330 projects the pattern of the reticle 320 onto the substrate 340. The projection optical system 330 also has a function of projecting a measurement pattern 12 of the measurement mask 10 onto the first measurement unit 20. The projection optical system 330 can be a dioptric system, a catadioptric system, or a catoptric system.

In this embodiment, a wafer is used as the substrate 340. However, it is also possible to use a glass plate or another substrate in place of a wafer. The substrate 340 is coated with a photoresist.

The substrate stage 345 holds the substrate 340 and the first measurement unit 20 and drives them using, for example, a linear motor.

The controller 350 includes a CPU and memory and controls the operation of the exposure apparatus 300. In this embodiment, the controller 350 calculates the scan defocus amounts of the reticle stage 325 and substrate stage 345 based on a change in the intensity of the light intensity distribution measured by the first measurement unit 20. In addition, the controller 350 corrects Z driving of the reticle stage 325 and substrate stage 345 based on the calculation result. This makes it possible to suppress scan defocus of the reticle stage 325 and substrate stage 345. The measurement and the defocus amount calculation can be performed while at least one of the reticle stage 325 and the substrate stage 345 is fixed in position. In this case, the scan defocus amounts of the reticle stage 325 and substrate stage 345 can be individually calculated and corrected.

The measurement mask 10 and first measurement unit 20 which constitute the measurement apparatus 1 for executing the measurement method according to the present invention can take any of the above-mentioned forms, and a detailed description thereof (their configurations and measurement operations) will not be given herein.

In the operation of the exposure apparatus 300, the scan defocus amounts of the reticle stage 325 and the substrate stage 345 are measured first. The scan defocus amounts of the reticle stage 325 and substrate stage 345 are measured using the measurement mask 10 and first measurement unit 20 which constitute the measurement apparatus 1, as described above. As the scan defocus amounts of the reticle stage 325 and substrate stage 345 are measured, Z driving of the reticle stage 325 and substrate stage 345 during scanning is adjusted based on the measurement results. This makes it possible to suppress defocus which occurs while the reticle 320 and substrate 340 are scanned.

The pattern of the reticle 320 is transferred onto the substrate 340 by exposure next. A light beam emitted by the light source unit 312 illuminates the reticle 320 by the illumination optical system 314. The light which bears the information of the pattern of the reticle 320 forms an image on the substrate 340 by the projection optical system 330. At this time, the reticle 320 and the substrate 340 are scanned while scan defocus is suppressed because Z driving of the reticle stage 325 and substrate stage 345 is accurately adjusted, as described above. Hence, the exposure apparatus 300 has an excellent exposure performance and can provide high-quality devices (e.g., a semiconductor device, an LCD device, an image sensing device (e.g., a CCD), and a thin-film magnetic head) with a high throughput and a good economical efficiency.

Micropatterned devices, for example a semiconductor device such as a semiconductor integrated circuit, a micromachine, and a thin-film magnetic head can be manufactured by, for example, a step of exposing a substrate to radiant energy using the above-mentioned scanning exposure apparatus, and a step of developing the exposed substrate.

These devices are manufactured by an exposure step of exposing a substrate to radiant energy using the above-mentioned scanning exposure apparatus, a development step of developing the substrate exposed in the exposure step, and other known steps (e.g., etching, resist removal, dicing, bonding, and packaging steps) of processing the substrate developed in the development step.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-119982, filed May 1, 2008, which is hereby incorporated by reference herein in its entirety.

What is claimed is:

1. A scanning exposure apparatus comprising:
a first stage which holds a reticle;
a second stage which holds a substrate;
a projection optical system which projects a pattern of the reticle onto the substrate;
a plurality of first measurement units arranged on said second stage; and
a controller, wherein a measurement mask is arranged on said first stage, each of said plurality of first measurement units includes a light-shielding member having an opening, and a photoelectric conversion element which receives light having passed through said opening, and measures, by said photoelectric conversion element, an intensity of light having passed through said opening in a light intensity distribution formed on said light-shielding member when at least one of said first stage and said second stage is scanned and a measurement pattern of the measurement mask is obliquely illuminated, and said controller calculates a defocus amount, while at least one of said first stage and said second stage is scanned, and a direction of defocus between the reticle and the substrate, based on a temporal change in a difference between a plurality of the light intensities measured by said plurality of first measurement units.

2. The apparatus according to claim 1, wherein the measurement pattern is a line-and-space pattern and includes a periodic pattern with lines which have a constant pitch and spaces which transmit light and have widths narrower in a direction from one of the central line and the central space to the outside, and, letting λ be a wavelength of exposure light of the scanning exposure apparatus, and NA be a numerical aperture of said projection optical system, a value obtained by normalizing a period of said periodic pattern by (λ/NA) is less than 1.

3. The apparatus according to claim 1, wherein said first measurement unit is arranged such that said opening is positioned at a position at which the intensity of the light having passed through said opening is one of a maximum light intensity of the light intensity distribution, a half of the maximum light intensity, and zero when said first stage and said second stage are scanned in synchronism with each other.

4. The apparatus according to claim 1, wherein at least one of the measurement pattern and said first measurement unit is arranged at not less than one image height in at least one direction of a direction parallel to a scanning direction in which said first stage and said second stage are scanned in synchronism with each other, and a direction perpendicular to the scanning direction.

5. The apparatus according to claim 1, wherein said controller calculates the defocus amount and the direction of defocus based on a derivative of the temporal change in the light intensity measured by said first measurement unit.

6. The apparatus according to claim 1, wherein
said controller calculates, based on a temporal change in an intensity of light having passed through said opening in a light intensity distribution formed on said light-shielding member by the measurement pattern, which is measured using said first measurement unit under a measurement condition under which no displacement of the light intensity distribution attributed to defocus occurs when said first stage and said second stage are scanned in synchronism with each other, a displacement amount of the light intensity distribution when said first stage and said second stage are scanned in synchronism with each other, and said controller corrects the defocus amount based on the calculated displacement amount.

7. A scanning exposure apparatus comprising:
a first stage which holds a reticle;
a second stage which holds a substrate;
a projection optical system which projects a pattern of the reticle onto the substrate;
a first measurement unit arranged on said second stage;
a second measurement unit which measures an amount of light having passed through the measurement pattern when at least one of said first stage and said second stage is scanned; and
a controller,
wherein a measurement mask is arranged on said first stage,
said first measurement unit includes a light-shielding member having an opening, and a photoelectric conversion element which receives light having passed through said opening, and measures, by said photoelectric conversion element, an intensity of light having passed through said opening in a light intensity distribution formed on said light-shielding member when at least one of said first stage and said second stage is scanned and a measurement pattern of the measurement mask is obliquely illuminated, and said controller corrects the light intensity measured by said first measurement unit by a variation in the light amount measured by said second measurement unit, and calculates a defocus amount, while at least one of said first stage and said second stage is scanned, based on the corrected light intensity.

8. A method of measuring a defocus amount for a scanning exposure apparatus including
a first stage which holds a reticle,
a second stage which holds a substrate,
a projection optical system which projects a pattern of the reticle onto the substrate, and
a plurality of measurement units which is arranged on the second stage, and includes a light-shielding member having an opening, and a photoelectric conversion element which receives light having passed through the opening,
the method comprising:
arranging a measurement mask having a measurement pattern on the first stage;
measuring, by the photoelectric conversion element, an intensity of light having passed through the opening in a light intensity distribution formed on the light-shielding member when at least one of the first stage and the second stage is scanned and the measurement pattern is obliquely illuminated; and
calculating a defocus amount, while at least one of the first stage and the second stage is scanned, and a direction of defocus between the reticle and the substrate, based on a temporal change in a difference between a plurality of the light intensities measured by the plurality of measurement units.

9. A method of manufacturing a device, the method comprising:
exposing a substrate to radiant energy using a scanning exposure apparatus;
developing the exposed substrate; and
processing the developed substrate to manufacture the device,
wherein the scanning exposure apparatus includes
a first stage which holds a reticle,
a second stage which holds a substrate,
a projection optical system which projects a pattern of the reticle onto the substrate,
a plurality of first measurement units arranged on the second stage, and
a controller,
a measurement mask is arranged on the first stage,
each of the plurality of first measurement units includes a light-shielding member having an opening, and a photoelectric conversion element which receives light having passed through the opening, and measures, by the photoelectric conversion element, an intensity of light having passed through the opening in a light intensity distribution formed on the light-shielding member when at least one of the first stage and the second stage is scanned and a measurement pattern of the measurement mask is obliquely illuminated, and the controller calculates a defocus amount, while at least one of the first stage and the second stage is scanned, and a direction of defocus between the reticle and the substrate, based on a temporal change in difference between a plurality of the light intensities measured by the plurality of first measurement units.

* * * * *